(12) United States Patent
Lu et al.

(10) Patent No.: US 11,551,967 B2
(45) Date of Patent: Jan. 10, 2023

(54) VIA STRUCTURE AND METHODS FOR FORMING THE SAME

(71) Applicant: Taiwan Semiconductor Manufacturing Company Limited, Hsinchu (TW)

(72) Inventors: Meng-Pei Lu, Hsinchu (TW); Ming-Han Lee, Taipei (TW); Shin-Yi Yang, New Taipei (TW); Tz-Jun Kuo, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 189 days.

(21) Appl. No.: 16/877,670

(22) Filed: May 19, 2020

(65) Prior Publication Data

US 2021/0366765 A1    Nov. 25, 2021

(51) Int. Cl.
*H01L 23/522* (2006.01)
*H01L 21/768* (2006.01)
*H01L 23/48* (2006.01)

(52) U.S. Cl.
CPC .... *H01L 21/76805* (2013.01); *H01L 21/7688* (2013.01); *H01L 21/76813* (2013.01); *H01L 21/76879* (2013.01); *H01L 23/481* (2013.01); *H01L 23/5226* (2013.01)

(58) Field of Classification Search
CPC ............. H01L 23/5226; H01L 23/5283; H01L 21/76805
See application file for complete search history.

(56) References Cited

U.S. PATENT DOCUMENTS

| | | | | |
|---|---|---|---|---|
| 6,011,311 A * | 1/2000 | Hsing | ................. | H01L 23/5226 257/E23.145 |
| 7,517,736 B2 * | 4/2009 | Mehta | ............... | H01L 21/76805 257/E21.575 |
| 9,397,045 B2 * | 7/2016 | Peng | ................. | H01L 21/76814 |
| 11,183,455 B2 * | 11/2021 | Motoyama | ........ | H01L 21/76877 |

* cited by examiner

*Primary Examiner* — Daniel Luke
(74) *Attorney, Agent, or Firm* — The Marbury Law Group, PLLC

(57) ABSTRACT

Vias and methods of making the same. The vias including a middle portion located in a via opening in an interconnect-level dielectric layer, a top portion including a top head that extends above the via opening and extends laterally beyond upper edges of the via opening and a bottom portion including a bottom head that extends below the via opening and extends laterally beyond lower edges of the via opening. The via may be formed from a refractory material.

20 Claims, 31 Drawing Sheets

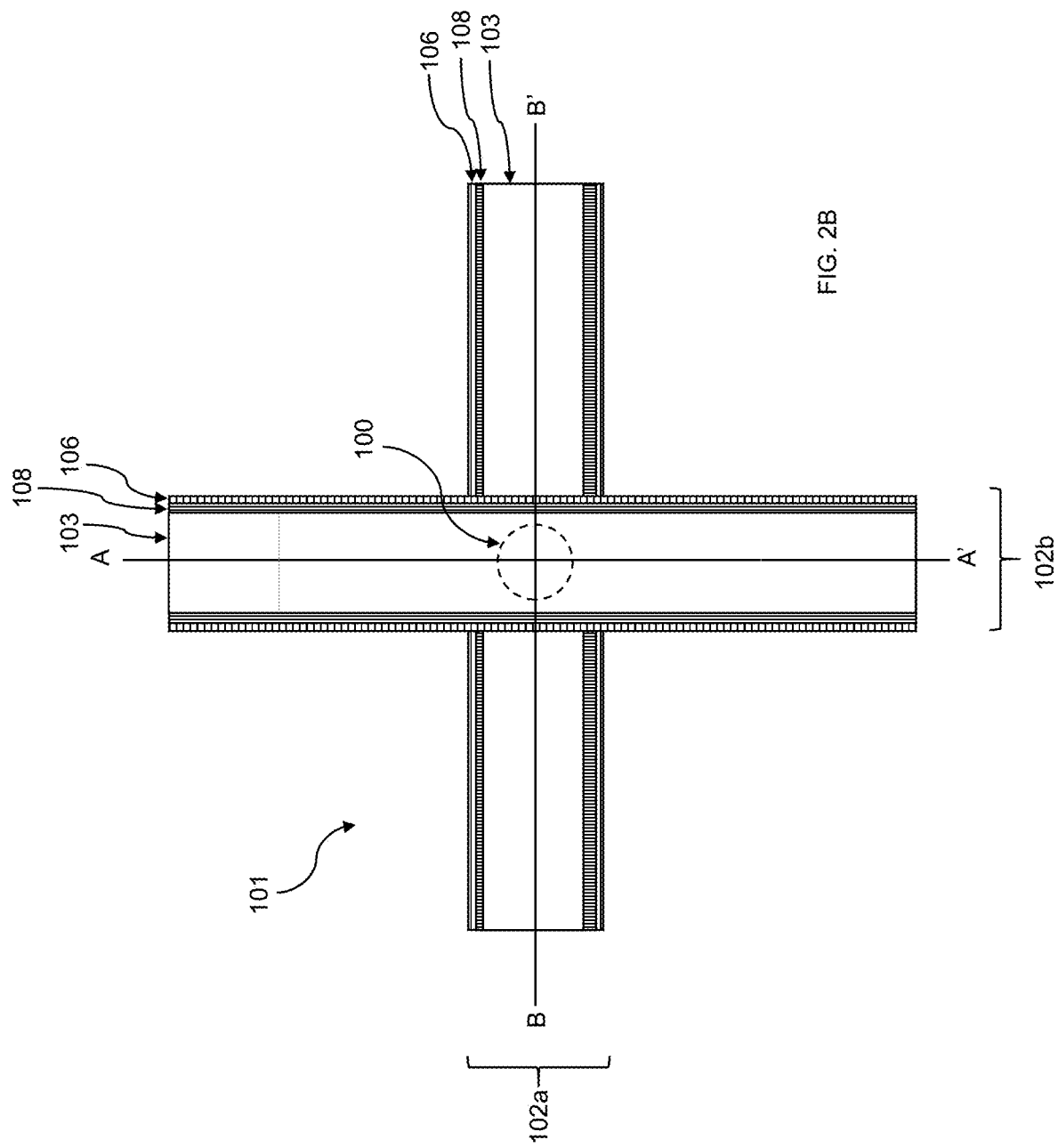

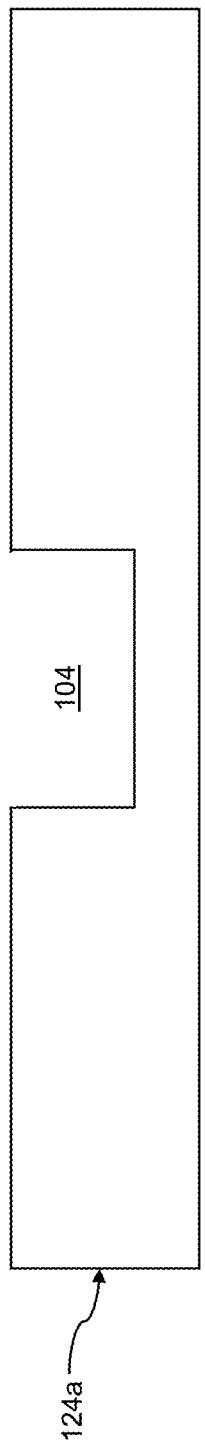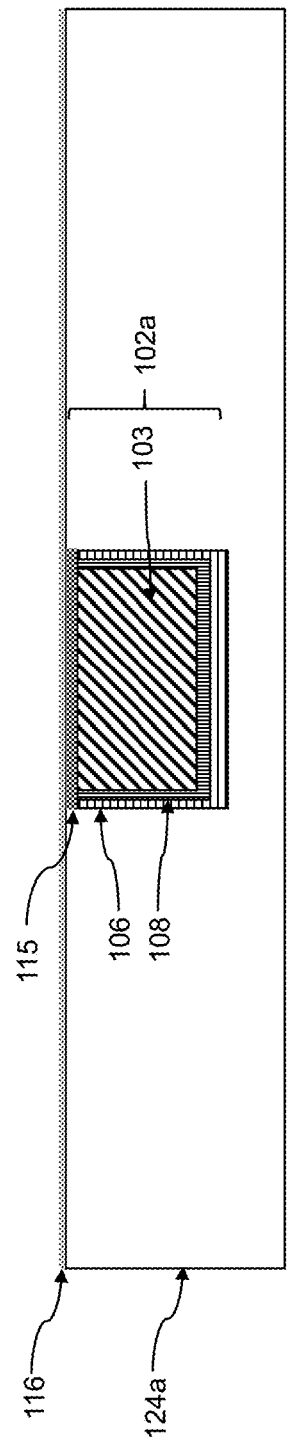

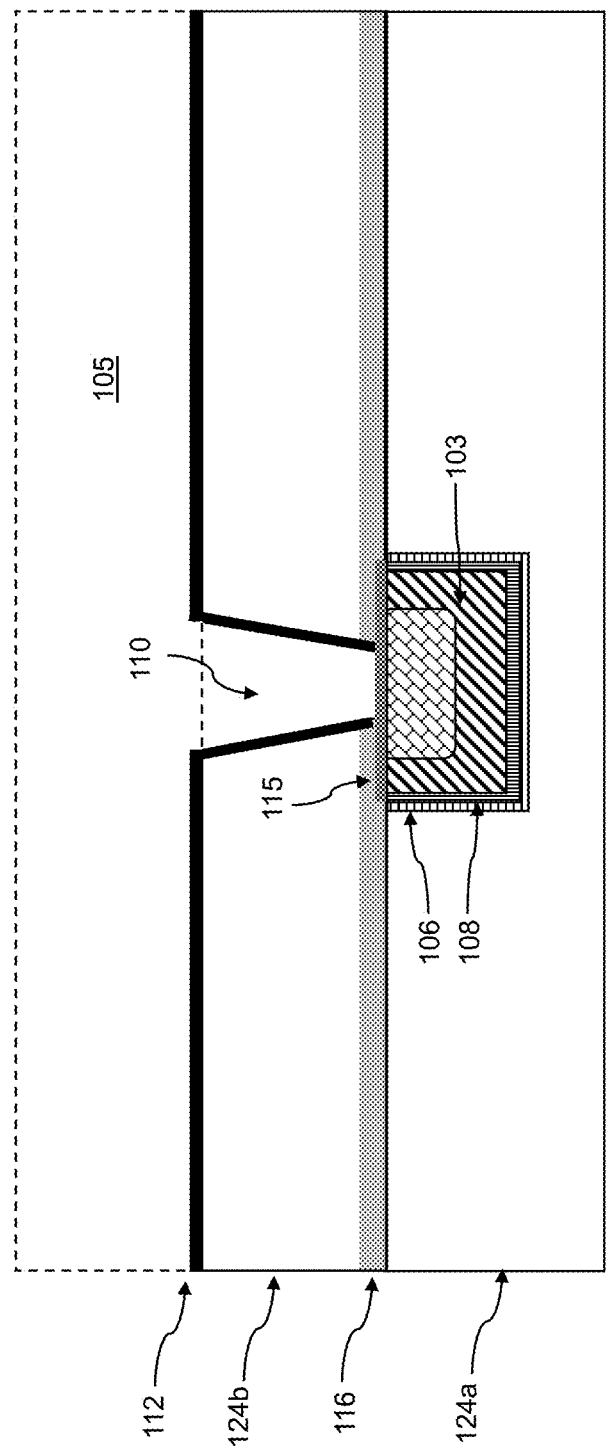

VIA STRUCTURE AND METHODS FOR FORMING THE SAME

BACKGROUND

Copper is a popular material to use to form interconnect structures such as metal lines and vias in semiconductor devices. However, copper tends to diffuse at typical semiconductor processing temperatures. As a result, copper interconnect structures may form voids during thermal cycling.

In addition, in interconnect structure, it is typically at the junctions where a via joins a metal line structure (e.g., word lines, bit lines, source lines) to form a corner that physical stress tends to concentrate. The combination of high temperature and stress concentration makes the junctions hot spots for void formation. The voids may cause electrical opens within the copper interconnect structures. Such defects adversely impact chip yield in advanced semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2B is a top down view of the simplified interconnect structure of FIG. 2A also illustrating diffusion barrier layers and copper adhesion layers.

FIG. 3 is a vertical cross-sectional view illustrating a step of etching openings in a first interconnect-level dielectric layer (ILD) to form openings for metallic lines in a method for fabricating and interconnect in accordance with various embodiments of the disclosure.

FIG. 4 is a vertical cross-sectional view illustrating a step of filling the openings in the first interconnect-level dielectric layer with a diffusion barrier layer, a metal adhesion layer, a first copper fill layer and capping layer in a method for fabricating a interconnect in accordance with various embodiments of the disclosure.

FIG. 24A is a vertical cross-sectional view illustrating a step of depositing a second interconnect-level dielectric layer, forming a via opening in the second interconnect-level dielectric layer and depositing a liner over the second interconnect-level dielectric layer in accordance with various embodiments of the disclosure.

DETAILED DESCRIPTION

Figure 1:
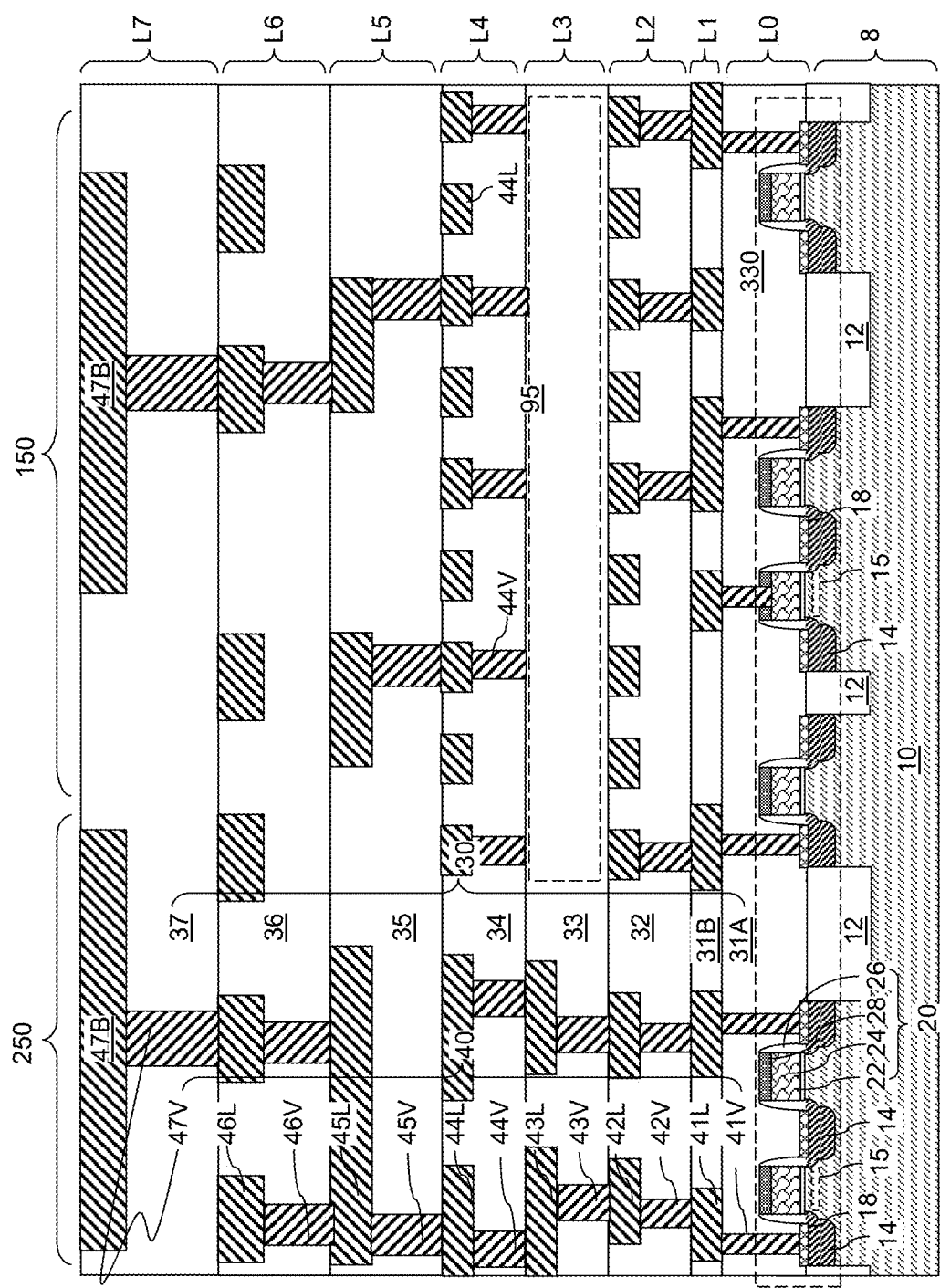
FIG. 1 is a vertical cross-sectional view of an integrated circuit after formation of upper-level metal interconnect structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed semiconductor devices, and specifically to metal interconnect structures including a via made of refractory materials.

Generally, the structures and methods of the present disclosure can be used to form interconnect structures such as vias, metal line structures and integrated via and metal line structures. The interconnect structures electrically connect at least some of the electrical components of an integrated circuit which may include a plurality of electrical components. The interconnect structures of the present disclosure include a via formed using a refractory metal or alloy of refractory metals. In some embodiments, the vias may include a bottom portion. The bottom portion may include a bottom head that that extends below the via opening and extends laterally beyond lower edges of the via opening. The via may further include a middle portion located in a via opening. The via may further include a top portion. The top portion may include a top head that extends above the via opening and extends laterally beyond upper edges of the via opening. The use of refractory metals, which can withstand higher temperatures than copper, reduces diffusion of the via atoms into the interconnect-level dielectric layers, thereby reducing the formation of voids around the vias. Further, the use refractory metal vias with head structures that extend into the metal line structures and extend beyond the edges of the vias further reduce void formation by covering the void formation hot spots with slower diffusing metals.

Referring to FIG. 1, a first exemplary structure that may implement the various embodiment interconnect structures 101 is illustrated. The first exemplary structure includes a substrate 8 that contains a semiconductor material layer 10. The substrate 8 may include a bulk semiconductor substrate such as a silicon substrate in which the semiconductor material layer continuously extends from a top surface of the substrate 8 to a bottom surface of the substrate 8, or a semiconductor-on-insulator layer including the semiconductor material layer 10 as a top semiconductor layer overlying a buried insulator layer (such as a silicon oxide layer). The exemplary structure may include various devices regions, which can include a memory array region 150 in which at least one array of resistive memory elements may be subsequently formed. The exemplary structure may also include a peripheral region 250 in which electrical connections between each array of resistive memory elements and a peripheral circuit including field effect transistors may be subsequently formed. Areas of the memory array region 150 and the peripheral region 250 may be employed to form various elements of the peripheral circuit.

Semiconductor devices such as field effect transistors may be formed on, and/or in, the semiconductor material layer 10. For example, shallow trench isolation structures 12 may be formed in an upper portion of the semiconductor material layer 10 by forming shallow trenches and subsequently filling the shallow trenches with a dielectric material such as silicon oxide. Other suitable dielectric materials are within the contemplated scope of disclosure. Various doped wells (not expressly shown) may be formed in various regions of the upper portion of the semiconductor material layer 10 by performing masked ion implantation processes.

Gate structures 20 may be formed over the top surface of the substrate 8 by depositing and patterning a gate dielectric layer, a gate electrode layer, and a gate cap dielectric layer. Each gate structure 20 can include a vertical stack of a gate dielectric 22, a gate electrode 24, and a gate cap dielectric 28, which is herein referred to as a gate stack (22, 24, 28). Ion implantation processes can be performed to form extension implant regions, which can include source extension regions and drain extension regions. Dielectric gate spacers 26 may be formed around the gate stacks (22, 24, 28). Each assembly of a gate stack (22, 24, 28) and a dielectric gate spacer 26 may constitute a gate structure 20. Additional ion implantation processes may be performed that use the gate structures 20 as self-aligned implantation masks to form deep active regions. Such deep active regions may include deep source regions and deep drain regions. Upper portions of the deep active regions may overlap with portions of the extension implantation regions. Each combination of an extension implantation region and a deep active region may constitute an active region 14, which may be a source region or a drain region depending on electrical biasing. A semiconductor channel 15 can be formed underneath each gate stack (22, 24, 28) between a neighboring pair of active regions 14. Metal-semiconductor alloy regions 18 may be formed on the top surface of each active region 14. Field effect transistors may be formed on the semiconductor material layer 10. Each field effect transistor can include a gate structure 20, a semiconductor channel 15, a pair of active regions 14 (one of which functions as a source region and another of which functions as a drain region), and optional metal-semiconductor alloy regions 18. A complementary metal-oxide-semiconductor (CMOS) circuit 330 may be provided on the semiconductor material layer 10, which may include a periphery circuit for the array(s) of resistive memory elements to be subsequently formed.

Various interconnect-level structures may be subsequently formed, which are formed prior to formation of an array of resistive memory elements and are herein referred to as lower interconnect-level structures (L0, L1, L2). In case a two-dimensional array of resistive memory elements is to be subsequently formed over two levels of interconnect-level metal lines, the lower interconnect-level structures (L0, L1, L2) may include a contact-level structure L0, a first interconnect-level structure L1, and a second interconnect-level structure L2. The contact-level structure L0 may include a planarization dielectric layer 31A including a planarizable dielectric material such as silicon oxide and various contact via structures 41V contacting a respective one of the active regions 14 or the gate electrodes 24 and formed within the planarization dielectric layer 31A. The first interconnect-level structure L1 includes a first interconnect-level dielectric layer 31B and first metal lines 41L formed within the first interconnect-level dielectric layer 31B. The first interconnect-level dielectric layer 31B is also referred to as a first line-level dielectric layer. The first metal lines 41L may contact a respective one of the contact via structures 41V. The second interconnect-level structure L2 includes a second interconnect-level dielectric layer 32, which may include a stack of a first via-level dielectric material layer and a second line-level dielectric material layer or a line-and-via-level dielectric material layer. The second interconnect-level dielectric layer 32 may have formed there within second interconnect-level metal interconnect structures (42V, 42L), which includes first metal via structures 42V and second metal lines 42L. Top surfaces of the second metal lines 42L may be coplanar with the top surface of the second interconnect-level dielectric layer 32.

In an embodiment, an array 95 of resistive memory elements may be formed in the memory array region 150 over the second interconnect-level structure L2. A third interconnect-level dielectric layer 33 may be formed during formation of the array 95 of resistive memory elements. The set of all structures formed at the level of the array 95 of resistive memory elements is herein referred to as a third interconnect-level structure L3.

Third interconnect-level metal interconnect structures (43V, 43L) may be formed in the third interconnect-level dielectric layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7. The fourth interconnect-level structure L4 may include a fourth interconnect-level dielectric layer 34 having formed therein fourth interconnect-level metal interconnect structures (44V, 44L), which can include third metal via structures 44V and fourth metal lines 44L. The fifth interconnect-level structure L5 may include a fifth interconnect-level dielectric layer 35 having formed therein fifth interconnect-level metal interconnect structures (45V, 45L), which can include fourth metal via structures 45V and fifth metal lines 45L. The sixth interconnect-level structure L6 may include a sixth interconnect-level dielectric layer 36 having formed therein sixth interconnect-level metal interconnect structures (46V, 46L), which can include fifth metal via structures 46V and sixth metal lines 46L. The seventh interconnect-level structure L7 may include a seventh interconnect-level dielectric layer 37 having formed therein sixth metal via structures 47V (which are seventh interconnect-level metal interconnect structures) and metal bonding pads 47B. The metal bonding pads 47B may be configured for solder bonding (which may employ C4 ball bonding or wire bonding), or may be configured for metal-to-metal bonding (such as copper-to-copper bonding).

Each interconnect-level dielectric layer may be referred to as an interconnect-level dielectric (ILD) layer 30. Each interconnect-level metal interconnect structures may be referred to as a metal interconnect structure 40. Each contiguous combination of a metal via structure and an overlying metal line located within a same interconnect-level structure (L2-L7) may be formed sequentially as two distinct structures by employing two single damascene processes, or may be simultaneously formed as a unitary structure employing a dual damascene process. Each of the metal interconnect structure 40 may include a respective metallic liner (such as a layer of TiN, TaN, or WN having a thickness in a range from 2 nm to 20 nm) and a respective metallic fill material. As discussed in further detail below, the metallic fill material may comprise copper. However, other suitable materials may be within the contemplated scope of disclosure. Various etch stop dielectric layers and dielectric capping layers may be inserted between vertically neighboring pairs of ILD layers 30, or may be incorporated into one or more of the ILD layers 30.

While the exemplary structure is illustrated employing an embodiment in which the array 95 of resistive memory elements may be formed as a component of a third interconnect-level structure L3, the array 95 of resistive memory elements may be formed as components of any other interconnect-level structure (e.g., L1-L7). Further, while the exemplary structure is illustrated with a set of eight interconnect-level structures, the exemplary structure may be formed with a different number of interconnect-level structures is employed.

Figure 2A:
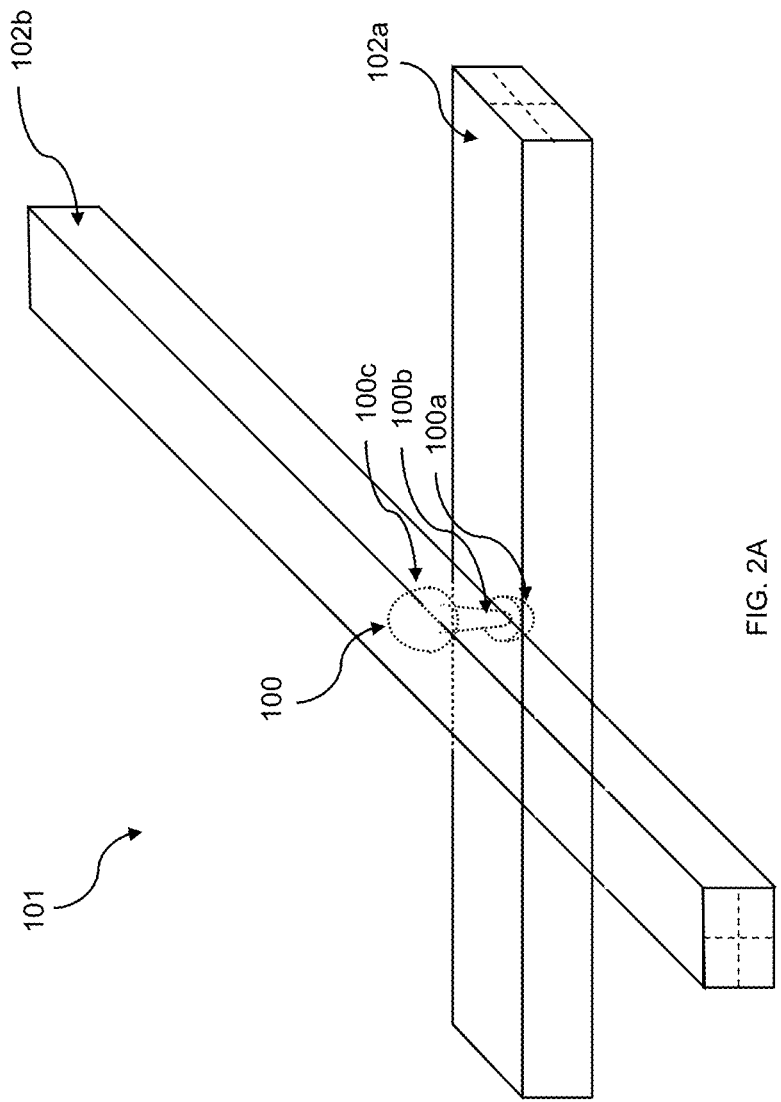
FIG. 2A is a perspective illustration of a simplified interconnect structure comprising a via in accordance with various embodiments of the disclosure.

FIGS. 2A and 2B illustrate a simplified exemplary interconnect structure 101 according to an embodiment of the present disclosure. The simplified illustrations omit materials such as interconnect-level dielectric layers 30 shown in FIG. 1. Interconnect-level dielectric layers may be referred to as first and second interconnect-level dielectric layers 124a and 124b as discussed below. First and second interconnect-level dielectric layers 124a and 124b may be any adjacent interconnect-level dielectric layers 30 shown in FIG. 1. The exemplary interconnect structure 101 may include a via 100 in accordance with various embodiments of the disclosure and at least one line structure 102a, 102b. The via 100 may include a top portion 100c which includes a top head, a middle portion 100b located in a via opening (discussed in more detail below) and a bottom portion 100a which includes a bottom head. The top portion 100c extends into a top line structure 102b. The top line structure 102b may be a line, such as a word line, bit line or source line. The bottom portion 100a extends into a bottom line structure 102a. The bottom line structure 102a may be a line, such as a word line, bit line or source line. The via 100 may be formed as any of the metal via structures discussed above with reference to FIG. 1. In addition, top line structure 102b and bottom line structure 102a may be formed as any of the metal lines of adjacent interconnect-level dielectric layers 30 discussed above with reference to FIG. 1. For example, top line structure 102b may be formed as fourth metal line 44L in FIG. 1, via 100 may be formed as fourth metal via structure 44V as shown in FIG. 1, and bottom line structure 102a may be formed as third metal line 43L as shown in FIG. 1.

Referring to FIG. 2B, the top line structure 102b and the bottom line structure 102a may include a first copper fill layer 103 and a diffusion barrier layer 106 over the first copper fill layer 103. The diffusion barrier layer 106 prevents copper atoms from the first copper fill layer 103 from diffusing out of the first copper fill layer 103 and into the various electronic devices, such as the field effect transistors discussed above. The presence of a diffusion barrier layer 106 may be advantageous because copper may damage the electronic devices. Optionally, an adhesion layer 108 may be provided between the diffusion barrier layer 106 and the first copper fill layer 103. The adhesion layer 108 improves the adhesion of the first copper fill layer 103 to the diffusion barrier layer 106. As illustrated and discussed in more detail below, the top portion 100c and the bottom portion 100a each extend beyond the edges of the via opening, resulting the via having a "dumbbell" shape.

FIG. 3 illustrates a first step in a method of making an interconnect structure 101 according to various embodiments. In the first step, a first interconnect-level dielectric layer 124a may be provided. While referred to as first interconnect-level dielectric layer 124a, such an interconnect-level dielectric layer may represent any of interconnect-level dielectric layers 30 as shown in FIG. 1. A first trench 104, such as a trench may be formed in the first interconnect-level dielectric layer 124a. The first trench 104 may be formed by first depositing a photoresist layer (not shown) over the surface of the first interconnect-level dielectric layer 124a. The photoresist layer may be photo-lithographically patterned to mask areas of the first interconnect-level dielectric layer 124a. Next, the first interconnect-level dielectric layer 124a may be etched using the patterned photoresist layer as a mask to form the first trench 104. The photoresist may be either a negative or a positive photoresist. The remaining photoresist layer may be removed, for example, by ashing.

Referring to FIG. 4, a diffusion barrier layer 106 may be conformally deposited on the bottom wall and sidewalls of the first trench 104. The diffusion barrier layer 106 may be made of a metal nitride or metal oxide material, such as TaN, TiN, WN, and $AlO_x$. Other suitable materials that may be used to form the diffusion barrier layer 106 are within the contemplated scope of disclosure. The diffusion barrier layer 106 may have a thickness in a range from 2 nm to 20 nm. In embodiments, an optional adhesion layer 108 may be conformally deposited over the diffusion barrier layer 106. The adhesion layer 108 adheres to both the diffusion barrier layer 106 and the first copper fill layer 103 that may be subsequently deposited. The adhesion layer 108 may provide better adhesion to both the first copper fill layer 103 and diffusion barrier layer 106 than the first copper fill layer 103 may have to the diffusion barrier layer 106 directly. The adhesion layer may be made of Cr, Ti or any other suitable metal or alloy and may have a thickness in a range from 2 nm to 20 nm. A capping layer 115 may be formed over the first trench 104 covering the diffusion barrier layer 106, the adhesion layer 108 and the first copper fill layer 103. "Selective," as used herein refers to the ability of one material to be etched at a higher rate than a different material subject to the same etchant. A "non-selective" material etches at substantial the same rate as other materials subjected to the same etchant. However, a non-selective material may be made selective with a suitable pretreatment, use of a particular precursor, use of selected etchants, incubation of the surface or a combination thereof. The capping layer may be made of the same material as the diffusion barrier layer 106 or any other suitable material. Optionally, one or more etch stop layer 116 may be deposited over the surface of the first interconnect-level dielectric layer 124a and the capping layer 115. The etch stop layer(s) 116 may be formed from metal nitride, a metal carbide or a metal oxide and may be made by any suitable method. Other etch stop layer materials are within the contemplated scope of disclosure. The diffusion barrier layer 106, adhesion layer 108 and first copper fill layer 103 formed within first trench 104 in the first interconnect-level dielectric layer 124a may comprise the metal line such as bottom line structure 102a.

Figure 5:
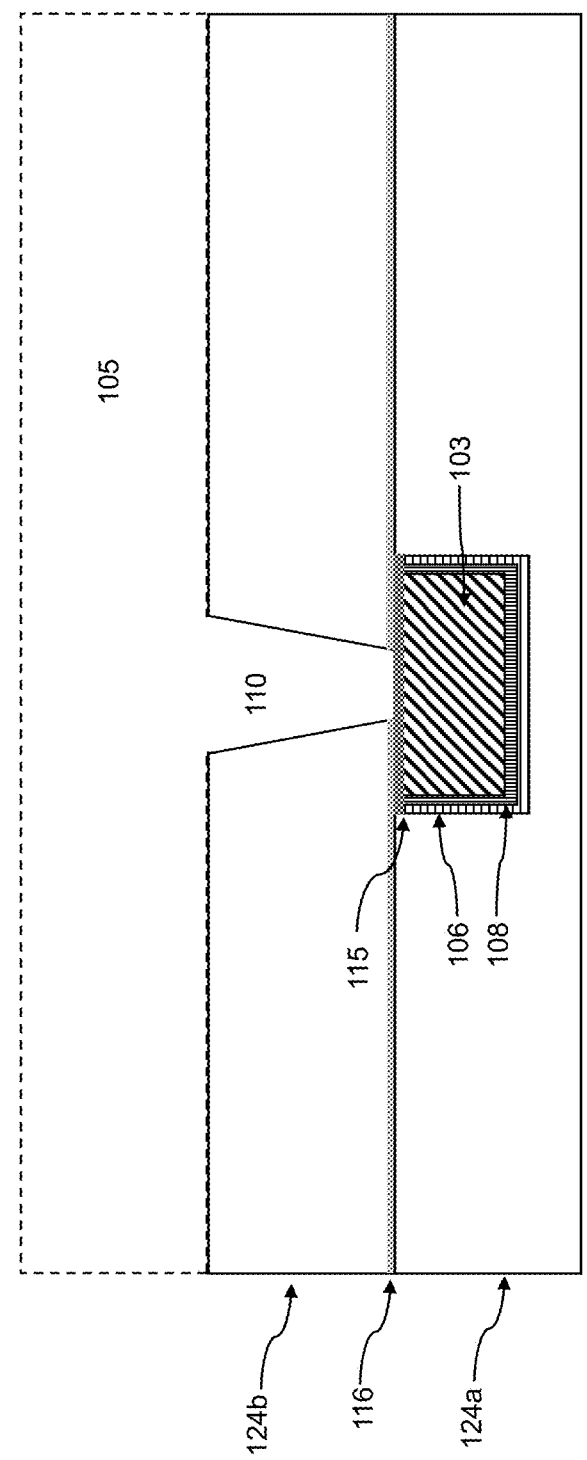
FIG. 5 is a vertical cross-sectional view illustrating a step of depositing a second interconnect-level dielectric layer and forming a via opening in a method for fabricating a interconnect in accordance with various embodiments of the disclosure.

Referring to FIG. 5, a second interconnect-level dielectric layer 124b may be formed over the one or more etch stop layers 116. The second interconnect-level dielectric layer 124b may be formed by any suitable method such as chemical vapor deposition, plasma enhanced chemical vapor deposition or atomic layer deposition. A second trench 105 may be formed in the second interconnect-level dielectric layer 124b. In an embodiment, the second trench 105 in the second interconnect-level dielectric layer 124b may be a trench which may aligned in a direction perpendicular to the first trench 104 in the first interconnect-level dielectric layer 124a. Further, as illustrated in FIG. 5, a via opening 110 may be formed in the in the bottom of the second trench 105 in the second interconnect-level dielectric layer 124b extending to the capping layer 115. The second trench 105 and the via opening 110 may be made with two separate single damascene processes or in the same step by a dual damascene process.

Figure 6:
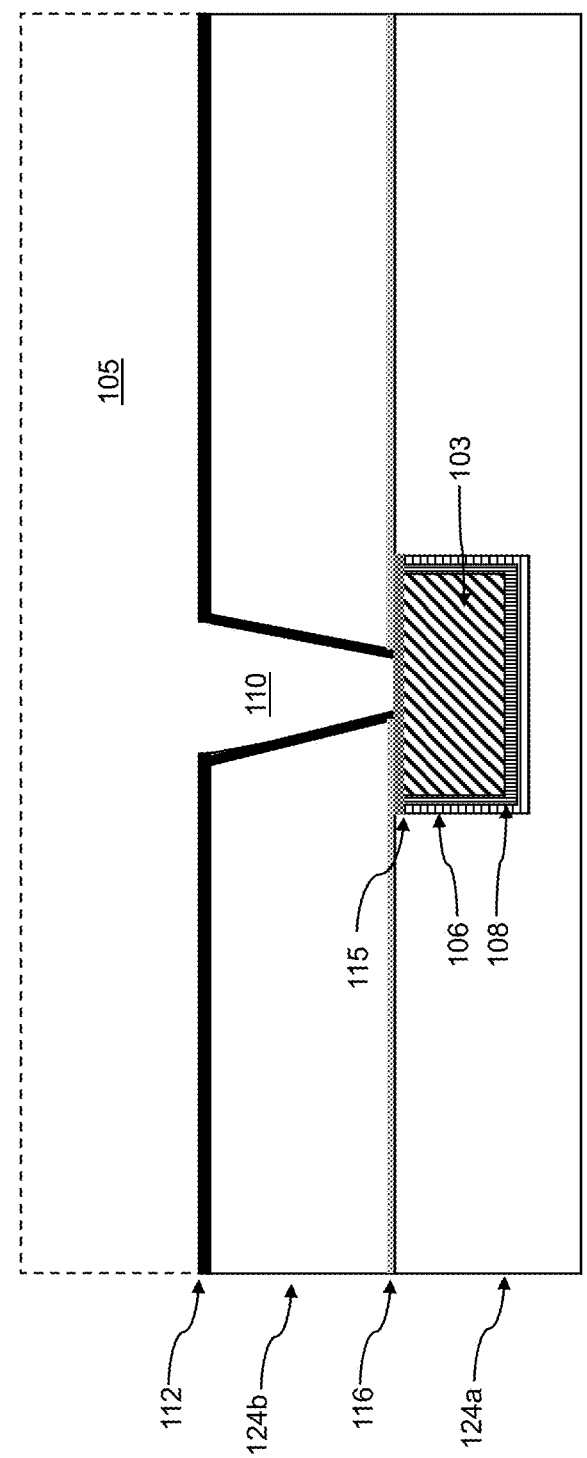
FIG. 6 is a vertical cross-sectional view illustrating a step of depositing a barrier layer on the second interconnect-level dielectric layer and sidewalls of the via opening in a method for fabricating a interconnect in accordance with various embodiments of the disclosure.

Referring to FIG. 6, a barrier layer 112 may be deposited in the second trench 105 in the second interconnect-level dielectric layer 124b. In embodiments, the barrier layer 112 may also be deposited on the sidewalls of the via opening 110. In embodiments, the barrier layer 112 may be made of a diffusion barrier material. For example, the barrier layer 112 may be made of Ta, Co, Ru or alloys thereof. The barrier layer 112 may be made of the same material as the diffusion barrier layer 106 or any other suitable material. Further, the barrier layer 112, may be deposited by any suitable method such as chemical vapor deposition, plasma enhanced chemical vapor deposition or atomic layer deposition.

Figure 7:
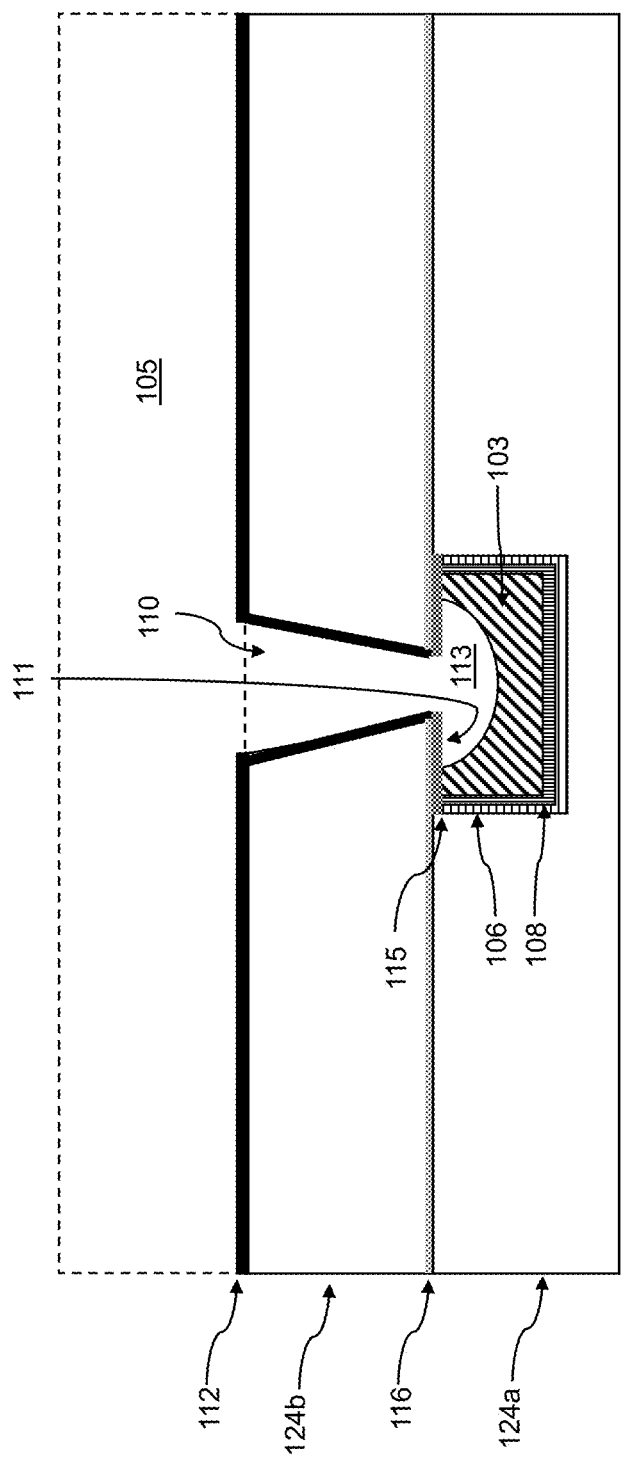
FIG. 7 is a vertical cross-sectional view illustrating a step of etching the first copper fill layer to form a cavity in the first copper fill layer in a method for fabricating a interconnect in accordance with various embodiments of the disclosure.

Referring to FIG. 7, the capping layer 115 and the first copper fill layer 103 may be etched to form a cavity 113 in the first copper fill layer 103. In various embodiments, the cavity 113 includes undercuts 111 which extend below the via opening 110 and extend laterally beyond lower edges of the via opening 110, i.e. the undercuts 111 extend below the capping layer 115. The resulting cavity 113 has bottom surface that is substantially concave. The capping layer 115 may be either dry etched or wet etched. To form the cavity 113 with the undercuts 111 in the first copper fill layer 103, the first copper fill layer 103 may first be wet or dry etched. Then, to form the undercuts 111, a first portion of the first copper fill layer 103 may be oxidized to form a second portion comprising copper oxide (not shown) under the capping layer. The copper oxide portion may then be removed by wet etching.

Figure 8:
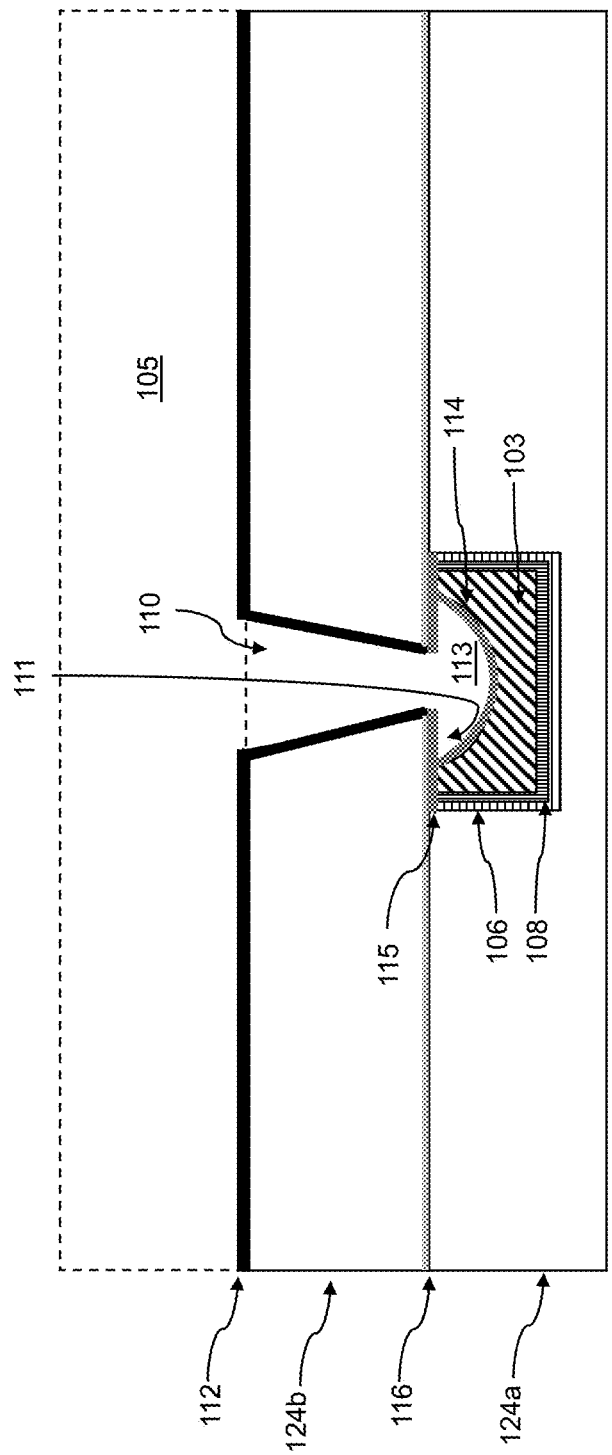
FIG. 8 is a vertical cross-sectional view illustrating a step of depositing a liner on the bottom of the via device in accordance with various embodiments of the disclosure.

Referring to FIG. 8, a first conformal liner 114 may be formed on the exposed surface of the first copper fill layer 103 in the cavity 113. The first conformal liner 114 may formed by any suitable method, such as chemical vapor deposition, plasma enhanced chemical vapor deposition or atomic layer deposition. The first conformal liner 114 may be made of the same material as the capping layer 115 or any other suitable material, such as Ta, Co, Ru or alloys thereof.

Figure 9:
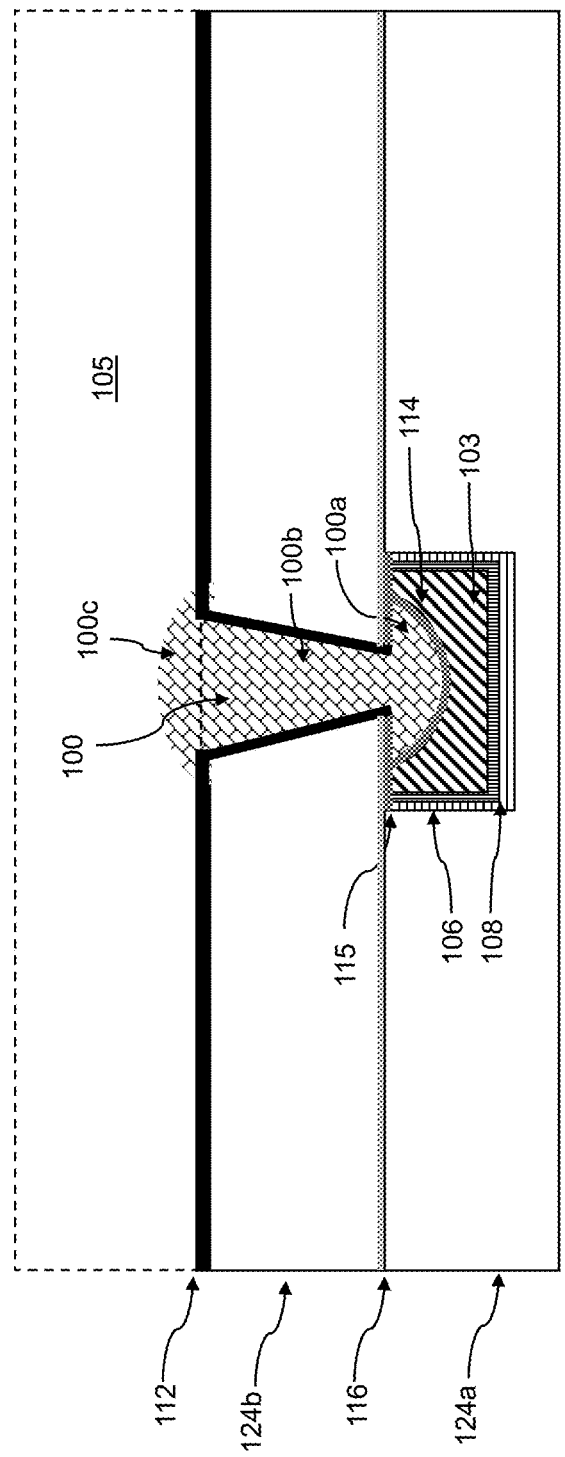
FIG. 9 is a vertical cross-sectional view illustrating a step of depositing a refractory metal in the cavity and the via opening in accordance with various embodiments of the disclosure.

Referring to FIG. 9, a refractory material, such as Ni, Co, Ru, Re, Ir, W, Mo, Rh, Fe, Pd, Pt, Os, Nb and alloys thereof, may be deposited in the cavity 113 in the first copper fill layer 103, the via opening 110 and overflowing into the second trench 105 in the second interconnect-level dielectric layer 124b. Other suitable refractory materials to form the via may be within the contemplated scope of disclosure. In this manner, a via 100 may be formed that includes a bottom portion 100a that includes a bottom head that extends below the via opening 110 and extends laterally beyond lower edges of the via opening 110, a middle portion 100b in the via opening 110 and a top portion 100c that includes a top head that extends above the via opening 110 and extends laterally beyond upper edges of the via opening 110 into the second trench 105 in the second interconnect-level dielectric layer 124b. As the refractory materials fill the cavity 113, the bottom surface of the resulting bottom portion 100a of the via 100 may have a shape that is substantially convex. The via 100 may be formed by a selective chemical vapor deposition process, a selective atomic layer deposition process or by an electrolysis plating deposition process.

Figure 10:
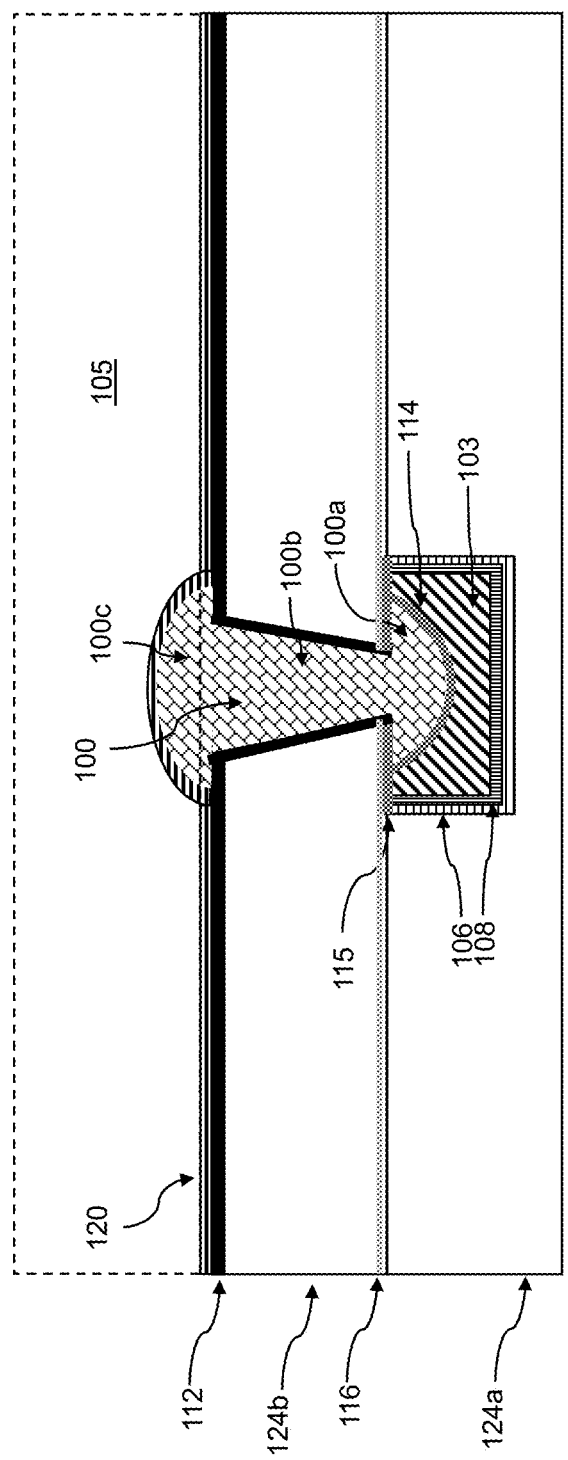
FIG. 10 is a vertical cross-sectional view illustrating a step of depositing a second conformal liner over the surface of the second interconnect-level dielectric layer and the refractory metal in accordance with various embodiments of the disclosure.

Referring to FIG. 10, a second conformal liner 120 may be formed over the barrier layer 112 and the top portion 100c of the via 100 in the second trench 105 in the second interconnect-level dielectric layer 124b. The second conformal liner 120 may be made of an suitable material, such as Ta, Co, Ru or alloys thereof. In various embodiments, the second conformal liner 120 is made of a material to improve adhesion of a first copper fill layer 103 to the barrier layer 112. The second conformal liner 120 made be formed by any suitable method such as chemical vapor deposition, plasma enhanced chemical vapor deposition or atomic layer deposition.

Figure 11:
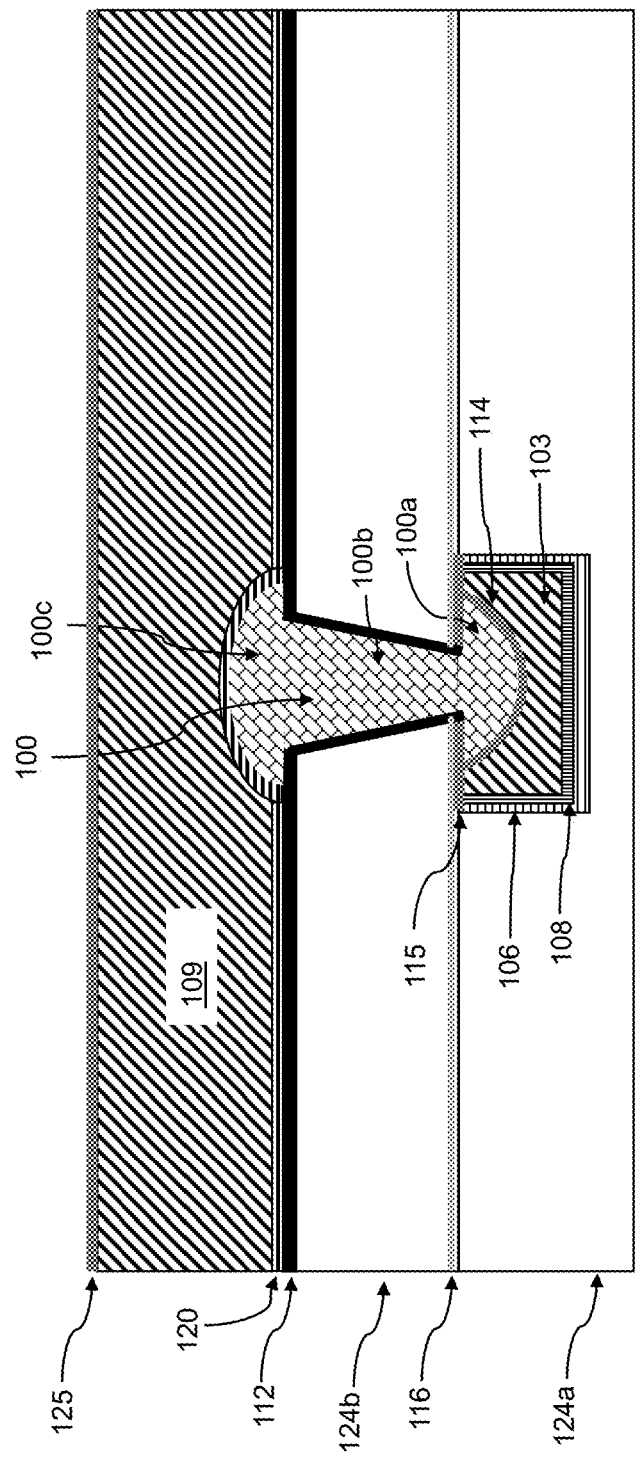
FIG. 11 is a vertical cross-sectional view illustrating a step of depositing a second copper fill layer over the second conformal liner in accordance with various embodiments of the disclosure.
Figure 12:
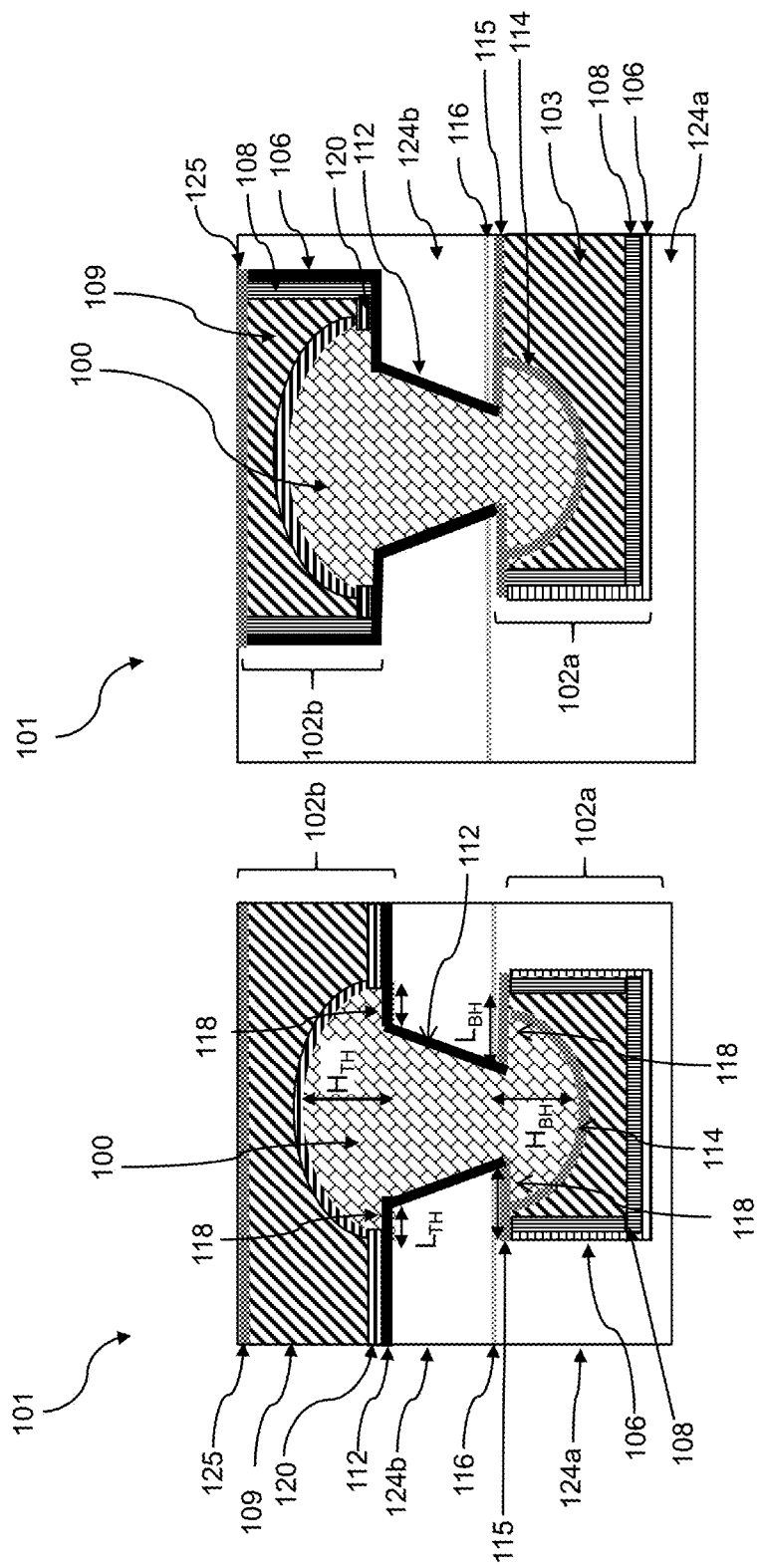
FIG. 12A is a vertical cross-sectional view through the line AA' in FIG. 2B.
FIG. 12B is a vertical cross-sectional view through the line BB' in FIG. 2B.

Referring to FIG. 11, the second trench 105 in the second interconnect-level dielectric layer 124b may be filled with a second copper fill layer 109. Prior to filling the second trench 105 with the second copper fill layer 109, a diffusion barrier layer 106 (not shown) may be conformally deposited on the sidewalls of the second trench 105. In addition, an optional adhesion layer 108 may be conformally deposited over the diffusion barrier layer 106 (both not shown in FIG. 11, shown in FIG. 12B) prior to second copper fill layer 109. After filling the second trench 105 with the second copper fill layer 109, the surface of the second interconnect-level dielectric layer 124b and the second copper fill layer 109 may be planarized by chemical mechanical polishing. After planarizing, the surface of the second interconnect-level dielectric layer 124b and the second copper fill layer 109, a second capping layer 125 may be formed on top of the planarized surface.

FIG. 12A is a vertical cross-sectional view through the line AA' in FIG. 2B while FIG. 12B is a vertical cross-sectional view through the line BB' in FIG. 2B. In various embodiments, the interconnect structure 101 includes a first interconnect-level dielectric layer 124a. Located within a first trench 104 in the first interconnect-level dielectric layer 124a may be a diffusion barrier layer 106, an optional adhesion layer 108 and a first copper fill layer 103. The bottom head of the bottom portion 100a of the via 100 may be located in a cavity 113 formed in the first copper fill layer 103. In some embodiments, a first conformal liner 114 may be provided between the first copper fill layer 103 and a bottom surface of bottom head of the bottom portion 100a of the via 100. A second interconnect-level dielectric layer 124b may be located above the first interconnect-level dielectric layer 124a. In some embodiments, an etch stop layer 116 may be provided between the first and second interconnect-level dielectric layers 124a, 124b.

Located within a second trench 105 (illustrated in FIG. 10) in the second interconnect-level dielectric layer 124b may be a diffusion barrier layer 106, an adhesion layer 108 and a second copper fill layer 109. The top portion 100c that includes a top head extends above the via opening 110 and extends laterally beyond upper edges of the via opening 110 into the second trench 105 in the second interconnect-level dielectric layer 124b. In some embodiments, a barrier layer 112 may be provided between a portion of the second copper fill layer 109 and the top head of the top portion 100c of the via 100. In some embodiments, the barrier layer 112 may extend into and line the via opening 110. The barrier layer 112 may be made of TaN, TiN, $AlO_x$, a self-assembled monolayer (SAM) or combinations thereof. Other suitable materials for the barrier layer 112 are within the contemplated scope of disclosure.

A middle portion 100b of the via 100 may be located in the via opening 110. As illustrated in FIG. 12A, the top head of the top portion 100c of the via 100 and the bottom head of the bottom portion 100a of the via 100 may cover junctions 118 between the via 100 and the top and bottom line structures 102a, 102b. By replacing the conventional copper material that may be conventionally used to form the via 100 with a slow diffusing refractory metal, the "dumbbell shaped" via 100 can reduce or eliminate void formation at the junctions 118. The refractory metal materials may be more resistant to reflow than conventional copper materials at typical semiconductor processing thermal temperatures.

The top head of the top portion 100c of the via 100 may have a maximum height $H_{TH}$ and the bottom head of the bottom portion 100a of the via 100 may have a maximum height $H_{BH}$ in the range of 1-20 nm, such as 2-15 nm, although greater or lesser heights may be used. The top head of the top portion 100c of the via 100 may extend a length $L_{TH}$ laterally beyond the upper edges of the via opening 110 and the bottom head of the bottom portion 100a of the via 100 may extend a length $L_{BH}$ laterally beyond the lower edges of the via opening 110 in a range of 1-20 nm, such as 2-15 nm, although greater or lesser lengths may be used.

Figure 13:
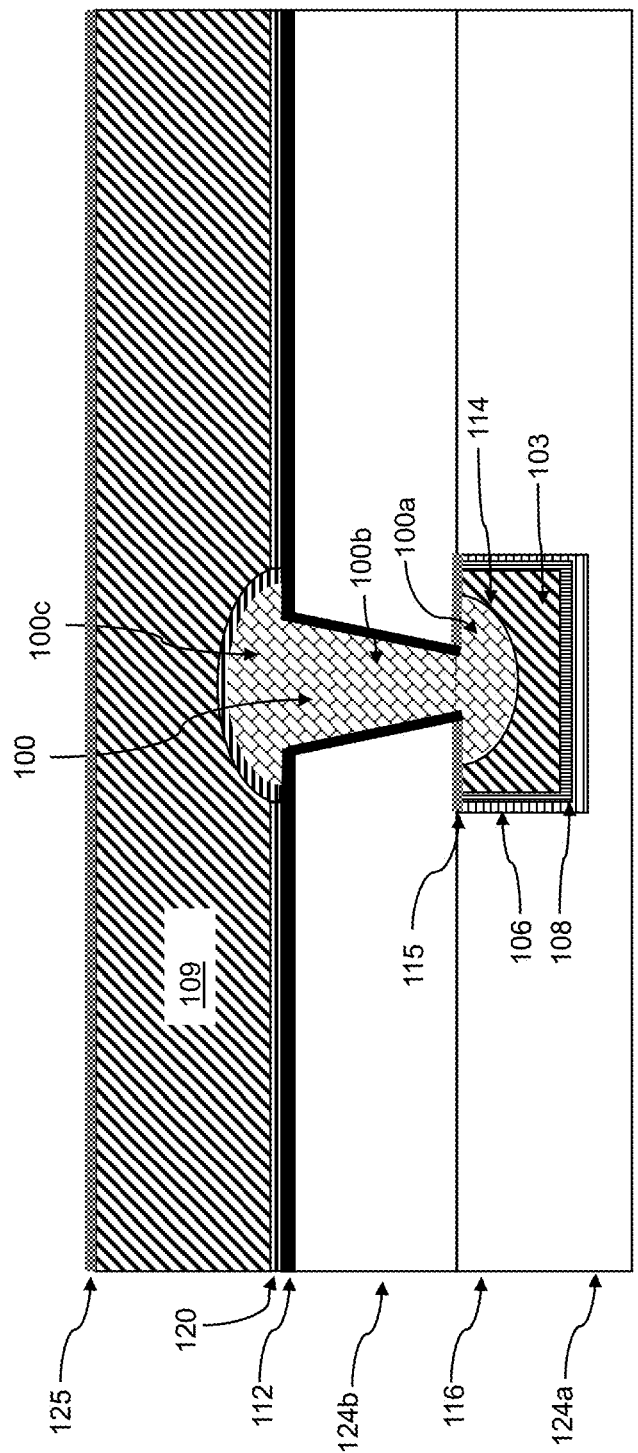
FIG. 13 is a vertical cross-sectional view illustrating another interconnect in accordance with various embodiments of the disclosure.

FIG. 13 is a vertical cross-sectional view illustrating another interconnect structure 101 in accordance with another embodiment of the disclosure. This embodiment is similar to embodiment illustrated in FIGS. 8-12B, but omits the first conformal liner 114 located between the first copper fill layer 103 in the bottom portion 100a of the via 100 that may be formed in the cavity 113 in the first interconnect-level dielectric layer 124a. The present embodiment may be fabricated by following the steps illustrated in FIGS. 3-7, but omitting the step illustrated in FIG. 8 that deposits the first conformal liner 114 and continuing fabrication with the steps illustrated in FIGS. 9-11 as discussed above.

Figure 14:
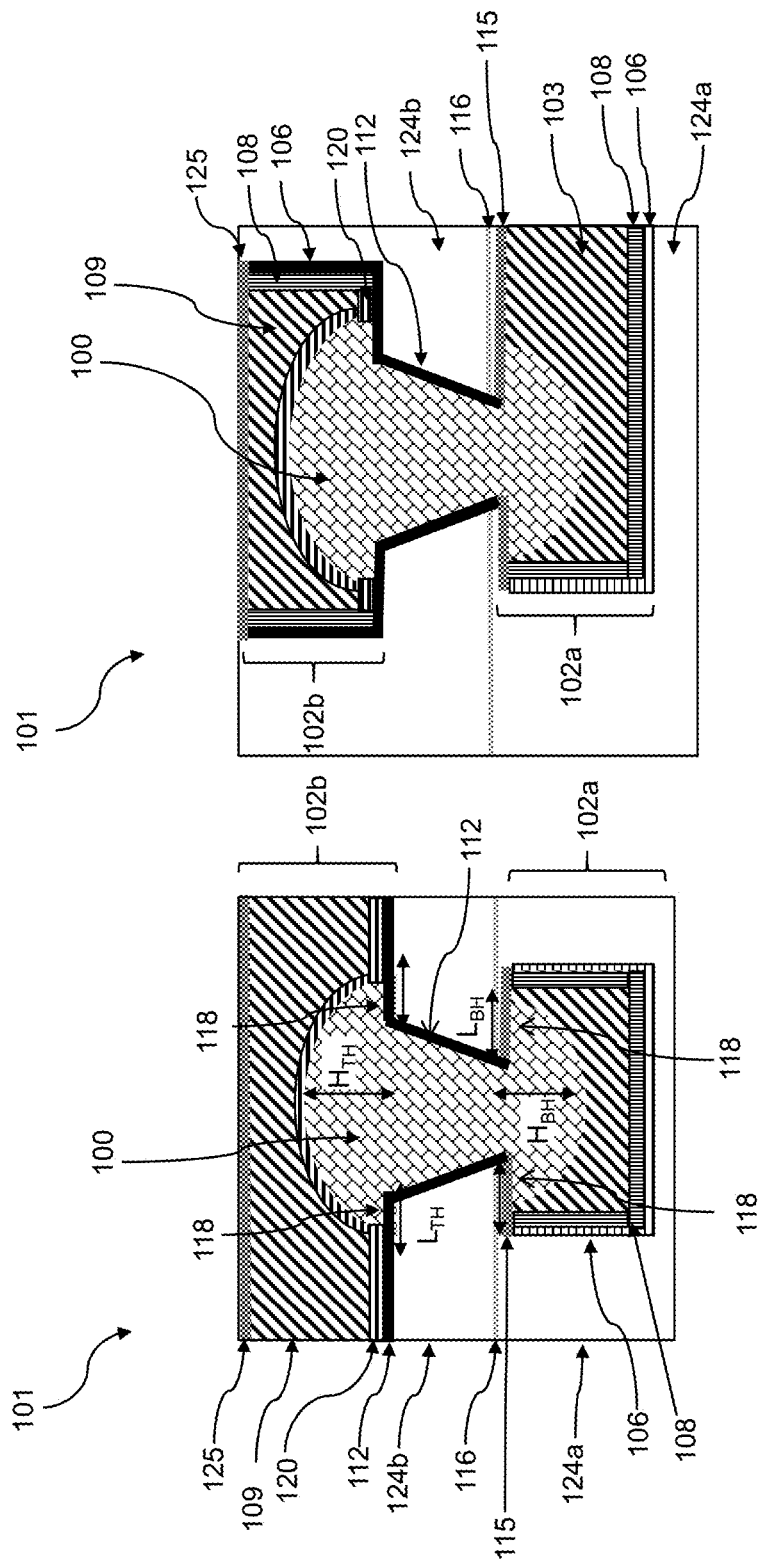
FIG. 14A is a vertical cross-sectional view of the embodiment of FIG. 13 as viewed through the line AA' in FIG. 2B.
FIG. 14B is a vertical cross-sectional view of the embodiment of FIG. 13 as viewed through the line BB' in FIG. 2B.

FIG. 14A is a vertical cross-sectional view of the second embodiment interconnect structure 101 shown in FIG. 13 through the line AA' in FIG. 2B. FIG. 14B is a vertical cross-sectional view of the second embodiment interconnect structure 101 shown in FIG. 13 through the line BB' in FIG. 2B. FIGS. 14A and 14B are similar to FIGS. 12A and 12B discussed above in regards to the first embodiment. As illustrated in FIGS. 14A and 14B, the interconnect structure 101 includes a via 100 similar to the first embodiment via 100 illustrated in FIGS. 12A and 12B, but omits a first conformal liner 114 located between the first copper fill layer 103 and the bottom head of the bottom portion 100a of the via 100. Similar to the first embodiment, the top head of the top portion 100c of the via 100 may have a maximum height $H_{TH}$ and the bottom head of the bottom portion 100a of the via 100 may have a maximum height $H_{BH}$ in the range of 1-20 nm, such as 2-15 nm, although greater or lesser heights may be used. The top head of the top portion 100c of the via 100 may extend a length $L_{TH}$ laterally beyond the upper edges of the via opening 110 and the bottom head of the bottom portion 100a of the via 100 may extend a length $L_{BH}$ laterally beyond the lower edges of the via opening 110 in a range of 1-20 nm, such as 2-15 nm, although greater or lesser lengths may be used.

Figure 15:
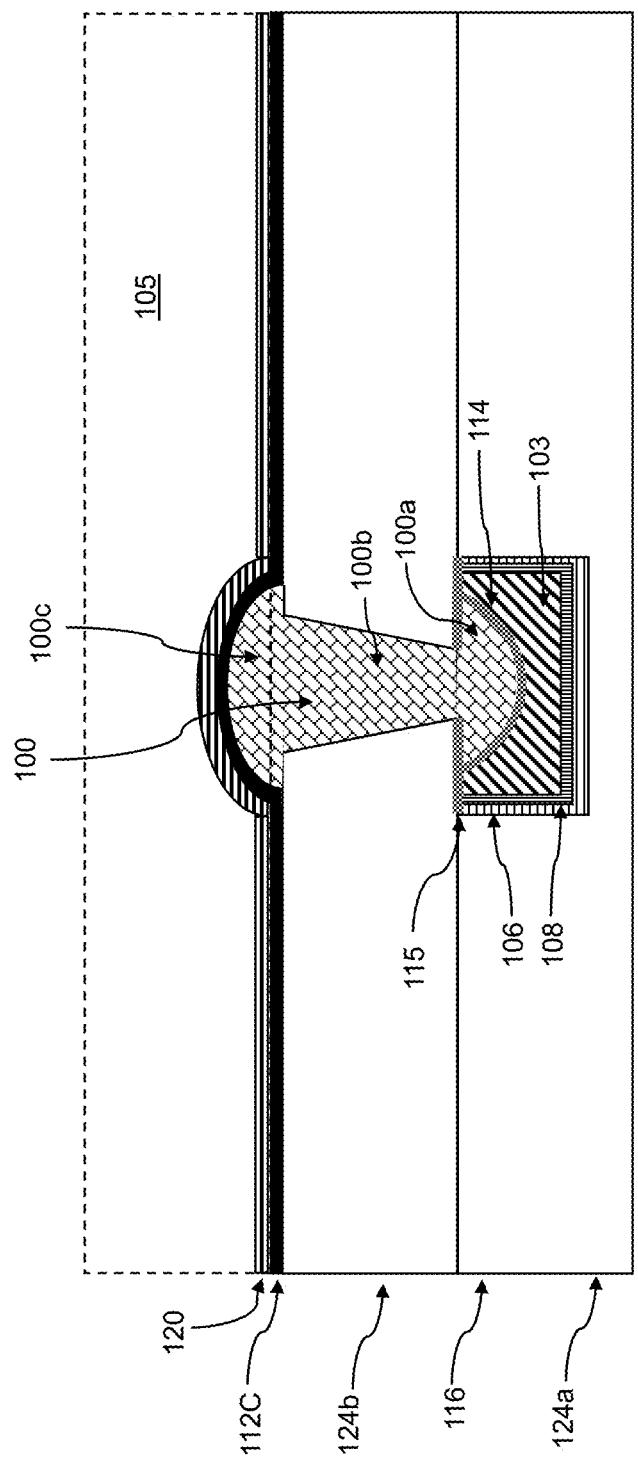
FIG. 15 is a vertical cross-sectional view illustrating a step of forming a second conformal liner and a barrier layer over another interconnect structure in accordance with various embodiments of the disclosure.
Figure 16:
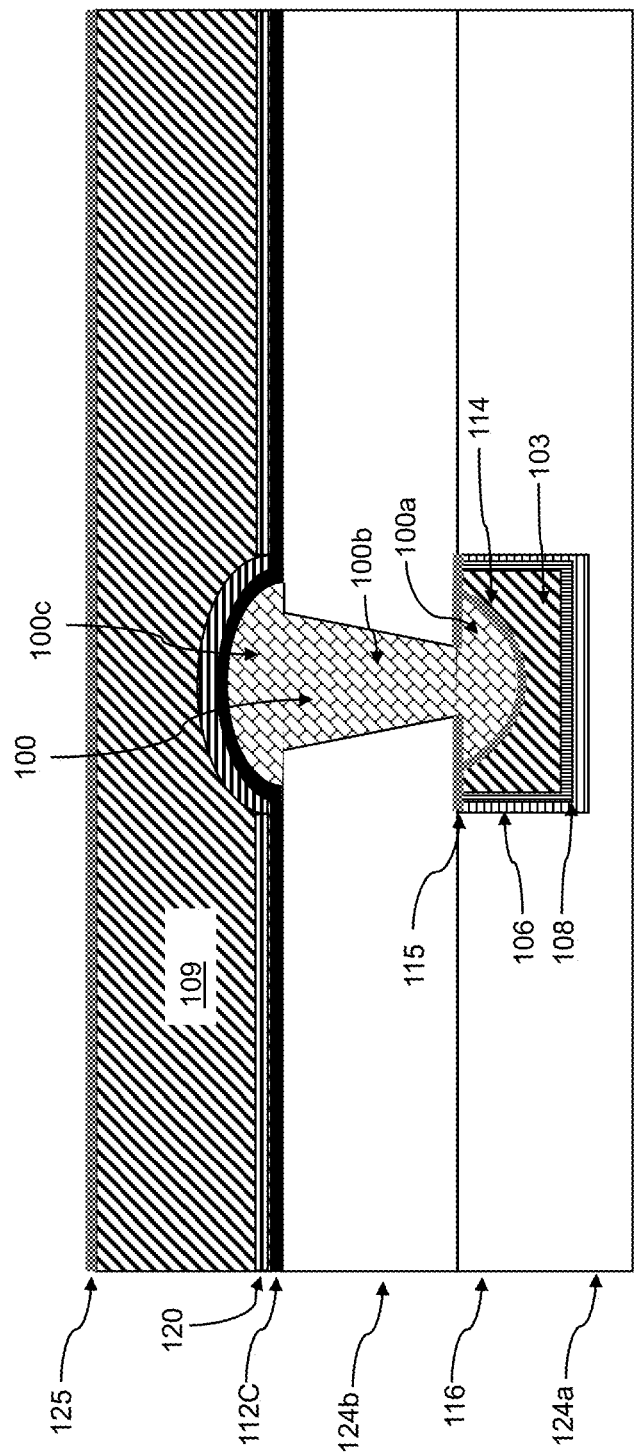
FIG. 16 is a vertical cross-sectional view illustrating a step of depositing a second copper fill layer over the liner of the intermediate device illustrated in FIG. 15 in accordance with various embodiments of the disclosure.

FIGS. 15-16 illustrate steps in fabrication another embodiment interconnect structure 101. The present embodiment may be fabricated by following the steps illustrated in FIGS. 3-5, but omitting the step illustrated in FIG. 6 that deposits a barrier layer 112 prior to depositing the refractory metal material to form the via 100, and continuing fabrication with the steps illustrated in FIGS. 7-9 as discussed above followed by the steps illustrated in FIGS. 15 and 16.

Referring to FIG. 15, a barrier layer 112 may be conformally deposited over the surface of the second interconnect-level dielectric layer 124b and the top portion 100c of the via 100 deposited in the second trench 105 in the second interconnect-level dielectric layer 124b to form a conformal barrier layer 112C. In this embodiment, the conformal barrier layer 112C may be made of a selective material, resulting in a selective barrier layer. Example, selective materials include, but are not limited to, TaN, TiN, $AlO_x$, a self-assembled monolayer (SAM) or combinations thereof. Other suitable selective materials for the conformal barrier layer 112C are within the contemplated scope of disclosure.

Figure 17:
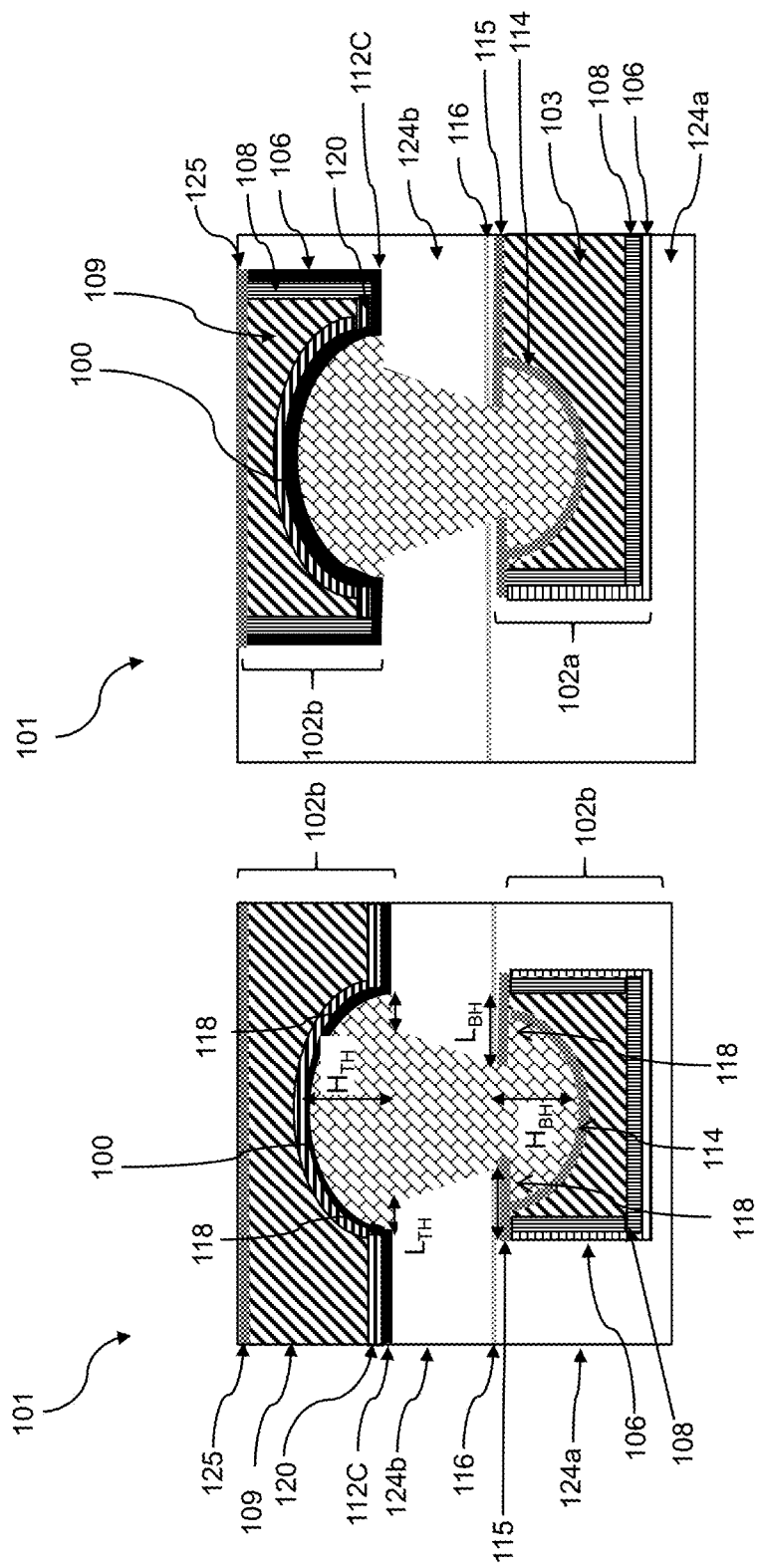
FIG. 17A is a vertical cross-sectional view of the embodiment of FIG. 16 as viewed through the line AA' in FIG. 2B.
FIG. 17B is a vertical cross-sectional view of the embodiment of FIG. 16 as viewed through the line BB' in FIG. 2B.

Next, a second conformal liner 120 may be deposited over the conformal barrier layer 112C. The second conformal liner 120 may be made of any suitable material and be formed by any suitable method such as chemical vapor deposition, plasma enhanced chemical vapor deposition or atomic layer deposition. The second conformal liner 120 may act as a copper adhesion layer and may be made of the same material as the adhesion layer 108. As illustrated in FIG. 17 below, sidewalls of the second trench 105 may be lined with a diffusion barrier layer 106 and an adhesion layer 108. In an embodiment, the conformal barrier layer 112C and the diffusion barrier layer 106 may be made of the same material. In an embodiment the conformal barrier layer 112C and the diffusion barrier layer 106 may be made in the same step and comprise a single continuous layer. In an embodiment, the second conformal liner 120 and the adhesion layer 108 may be made of the same material. In an embodiment the second conformal liner 120 and the adhesion layer 108 may be made in the same step and comprise a single continuous layer.

Referring to FIG. 16, the second trench 105 in the second interconnect-level dielectric layer 124b may be filled with a second copper fill layer 109. After filling the second trench 105, the surface of the second interconnect-level dielectric layer 124b and the second copper fill layer 109 may be planarized by chemical mechanical polishing. After planarizing, the surface of the second interconnect-level dielectric layer 124b and the second copper fill layer 109, a second capping layer 125 may be formed on top of the planarized surface.

FIG. 17A is a vertical cross-sectional view of the third embodiment interconnect structure 101 shown in FIG. 16 through the line AA' in FIG. 2B. FIG. 17B is a vertical cross-sectional view of the third embodiment interconnect structure 101 shown in FIG. 16 through the line BB' in FIG. 2B. FIGS. 17A and 17B are similar to FIGS. 12A and 12B discussed above in regards to the first embodiment. As illustrated in FIGS. 17A and 17B, the via opening 110 in the second interconnect-level dielectric layer 124b does not include a barrier layer 112 on the sidewalls of the via opening 110. However, the copper fill layers 103 may be isolated from the first and second interconnect-level dielectric layers 124a, 124b by the diffusion barrier layers 106, the conformal barrier layer 112C, the first conformal liner 114 and the capping layer 115. Thus, diffusion of copper from copper fill layers 103 into the first and second interconnect-level dielectric layers may be prevented. Similar to the first and second embodiments, the top head of the top portion 100c of the via 100 may have a maximum height $H_{TH}$ and the bottom head of the bottom portion 100a of the via 100 may have a maximum height $H_{BH}$ in the range of 1-20 nm, such as 2-15 nm, although greater or lesser heights may be used. The top head of the top portion 100c of the via 100 may extend a length $L_{TH}$ laterally beyond the upper edges of the via opening 110 and the bottom head of the bottom portion 100a of the via 100 may extend a length $L_{BH}$ laterally beyond the lower edges of the via opening 110 in a range of 1-20 nm, such as 2-15 nm, although greater or lesser lengths may be used.

Figure 18:
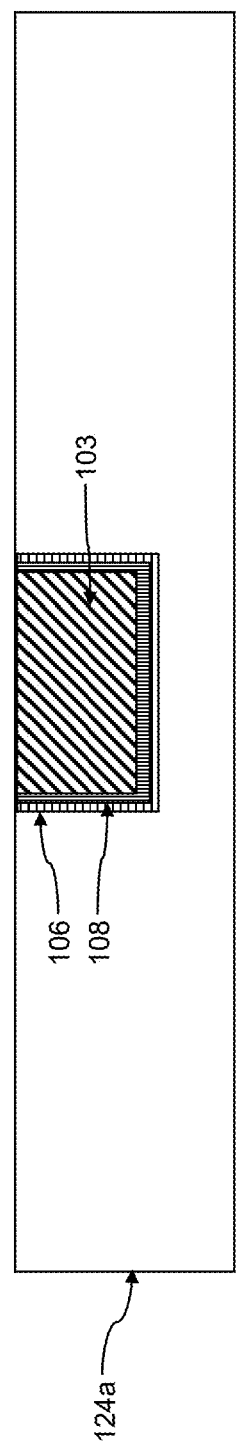
FIG. 18 is a vertical cross-sectional view illustrating a step of filling an opening in the first interconnect-level dielectric layer with a diffusion barrier layer, a metal adhesion layer and a first copper fill layer in a method for fabricating another interconnect in accordance with various embodiments of the disclosure.

FIGS. 18-27 illustrate steps in making an interconnect structure 101 according to a fourth embodiment. Referring to FIG. 18, a first trench 104 may be formed in a first interconnect-level dielectric layer 124a as illustrated in FIG. 3 and described above. A diffusion barrier layer 106, an optional adhesion layer 108 and a first copper fill layer 103 may be deposited in the first trench 104 in the first inter-connect-level dielectric layer 124a as illustrated in FIG. 4 and discussed above. However, in contrast to the first embodiment illustrated in FIG. 4, a capping layer 115 may be omitted from being deposited over the diffusion barrier layer 106, the adhesion layer 108 and the first copper fill layer 103. In addition, the optional etch stop layer illustrated in FIG. 4 may be omitted.

Figure 19:
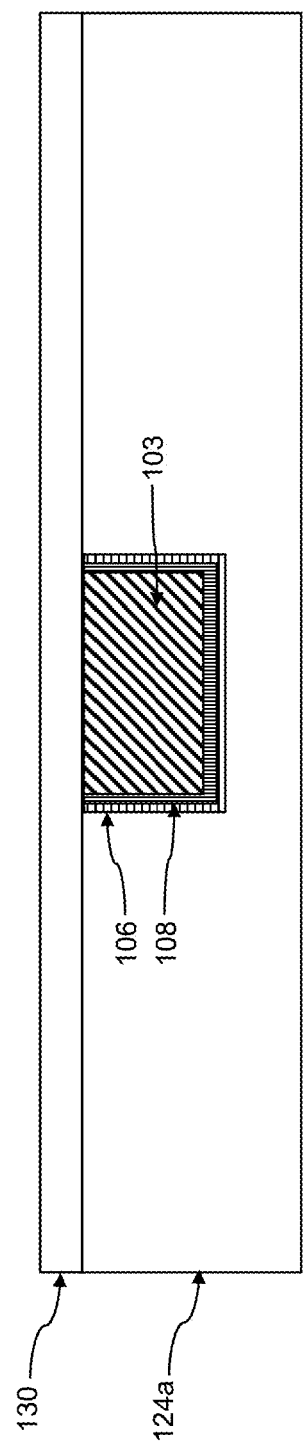
FIG. 19 is a vertical cross-sectional view illustrating a step of forming a hard mask over the first interconnect-level dielectric layer, the diffusion barrier layer, the metal adhesion layer and the first copper fill layer of FIG. 15 accordance with various embodiments of the disclosure.

Referring to FIG. 19, a hard mask layer 130 may be deposited over the surface of the first interconnect-level dielectric layer 124a, the diffusion barrier layer 106, the adhesion layer 108 and the first copper fill layer 103. The hard mask layer 130 may be made of a metal oxide or metal nitride. Other suitable hard mask materials may be within the contemplated scope of disclosure.

Figure 20:
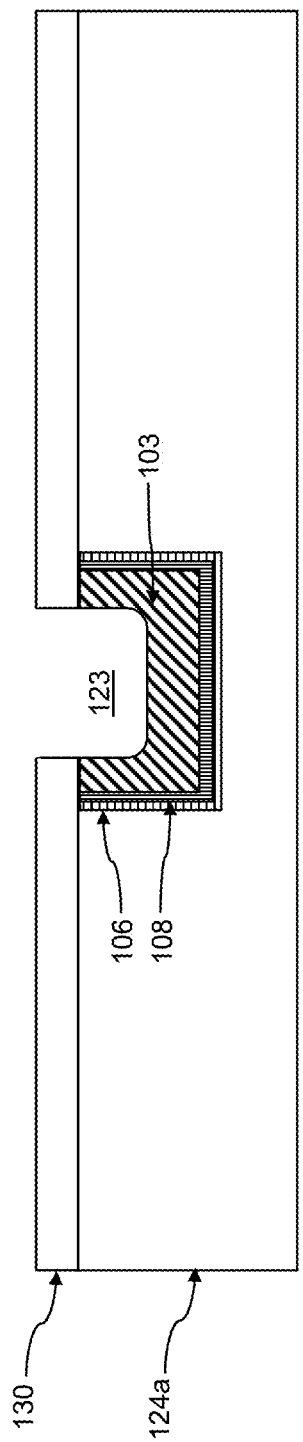
FIG. 20 is a vertical cross-sectional view illustrating a step of patterning and etching the hard mask layer and the first copper fill layer to form a cavity in the copper fill layer in accordance with various embodiments of the disclosure.

Referring to FIG. 20, the first copper fill layer 103 may be etched to form a cavity 123 in the first copper fill layer 103. First, a photoresist (not shown) may be deposited over the hard mask layer and photo-lithographically patterned to transfer a pattern to the hard mask layer 130. The patterned photoresist layer may be used as a mask to etch the hard mask layer 130 to form a patterned hard mask layer 130. The patterned hard mask layer 130 may be used as a mask when etching the cavity 123 in the first copper fill layer 103. As illustrated in FIG. 20 the cavity 123 may have a substantially rectangular cross section that does not have an undercut portion. Further, the cavity 123 may have a bottom surface that is substantially planar. As the refractory materials fill the cavity 123, the bottom surface of the resulting bottom portion 100a of the via 100 may have a shape that is substantially planar.

Figure 21:
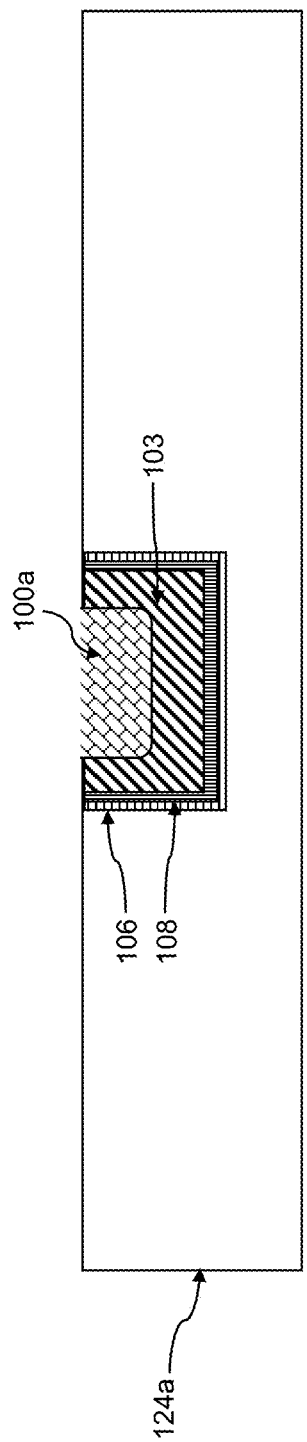
FIG. 21 is a vertical cross-sectional view illustrating a step of filling the cavity in the first copper fill layer with a refractory metal in accordance with various embodiments of the disclosure.

Referring to FIG. 21, the cavity 123 in the first copper fill layer 103 may be filled with a refractory metal to form the bottom portion 100a of a via 100. The cavity 123 may be filled prior to removing the hard mask layer 130 or after removing the hard mask layer 130. In this embodiment, the bottom portion 100a of the via 100 may have a substantially rectangular shape matching the shape of the cavity 123. Further, the bottom portion 100a of the via 100 may have a bottom surface that is substantially planar. After removing the hard mask layer 130, the surface of the first interconnect-level dielectric layer 124a and the bottom portion 100a of the via 100 may be planarized, such as with a chemical mechanical polishing process.

Figure 22:
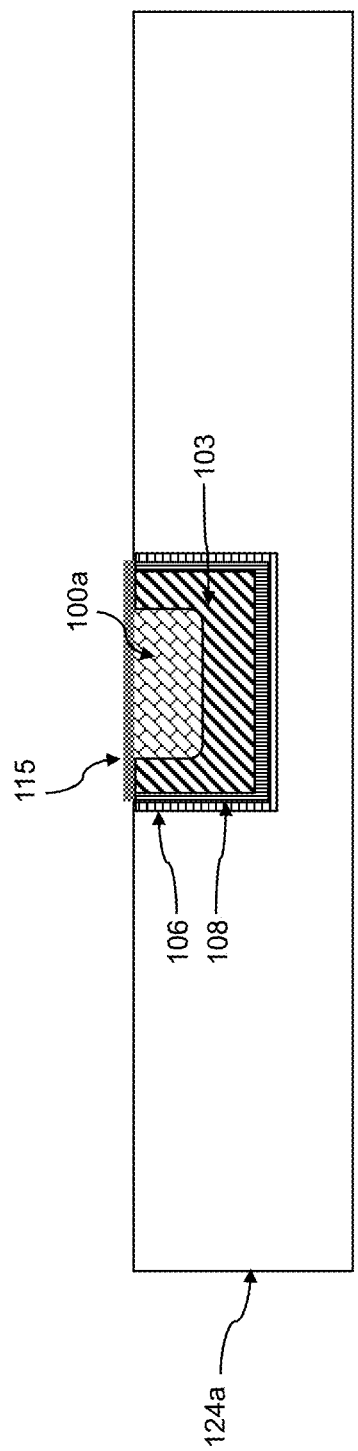
FIG. 22 is a vertical cross-sectional view illustrating a step of depositing a capping layer over the adhesion layer, first copper fill layer and refractory metal in accordance with various embodiments of the disclosure.

Referring to FIG. 22, a capping layer 115 may be deposited over the surface of the adhesion layer 108, the first copper fill layer 103 and the bottom portion 100a of the via 100. The capping layer 115 may be made of the same materials and made by the same processes as the capping layer 115 illustrated in the first embodiment and discussed above.

Figure 23:
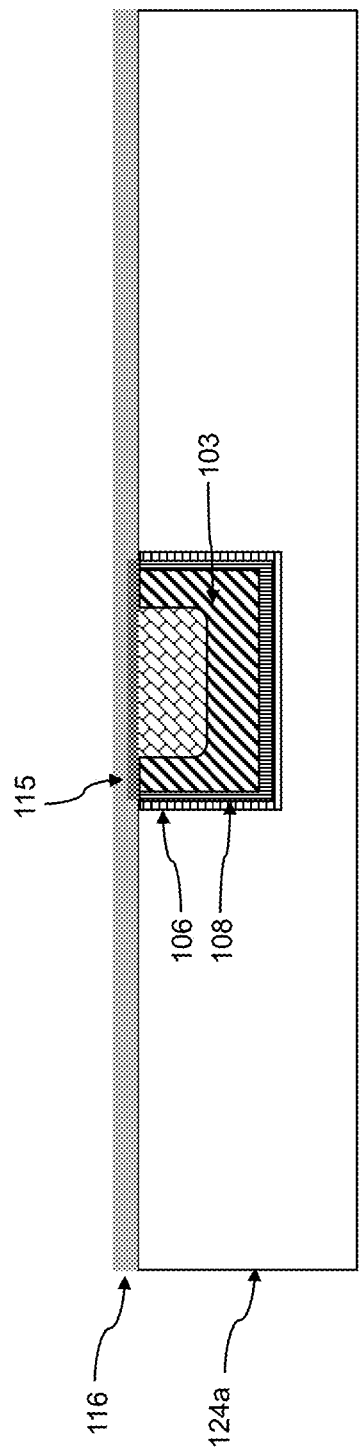
FIG. 23 is a vertical cross-sectional view illustrating a step of depositing an etch stop layer over the first interconnect-level dielectric layer and the capping layer in accordance with various embodiments of the disclosure.

Referring to FIG. 23, an etch stop layer 116 may be deposited over the surface of the first interconnect-level dielectric layer 124a, exposed portions of the diffusion barrier layer 106 and the capping layer 115. The etch stop layer 116 may be made of the same materials and by the same methods as the etch stop layer illustrated in FIG. 4 and described above.

Referring to FIG. 24A, a second interconnect-level dielectric layer 124b may be deposited over the etch stop layer 116. Similarly to the step illustrated in FIG. 5 and discussed above, a second trench 105 may be formed in the second interconnect-level dielectric layer 124b. Further, as discussed above in regards to the first embodiment, a via opening 110 may be formed in the in the bottom of the second trench 105 in the second interconnect-level dielectric layer 124b extending to the capping layer 115. Next, a barrier layer 112 may be deposited in the second trench 105 in the second interconnect-level dielectric layer 124b. In embodiments, the barrier layer 112 may also be deposited on the sidewalls of the via opening 110.

Figure 24B:
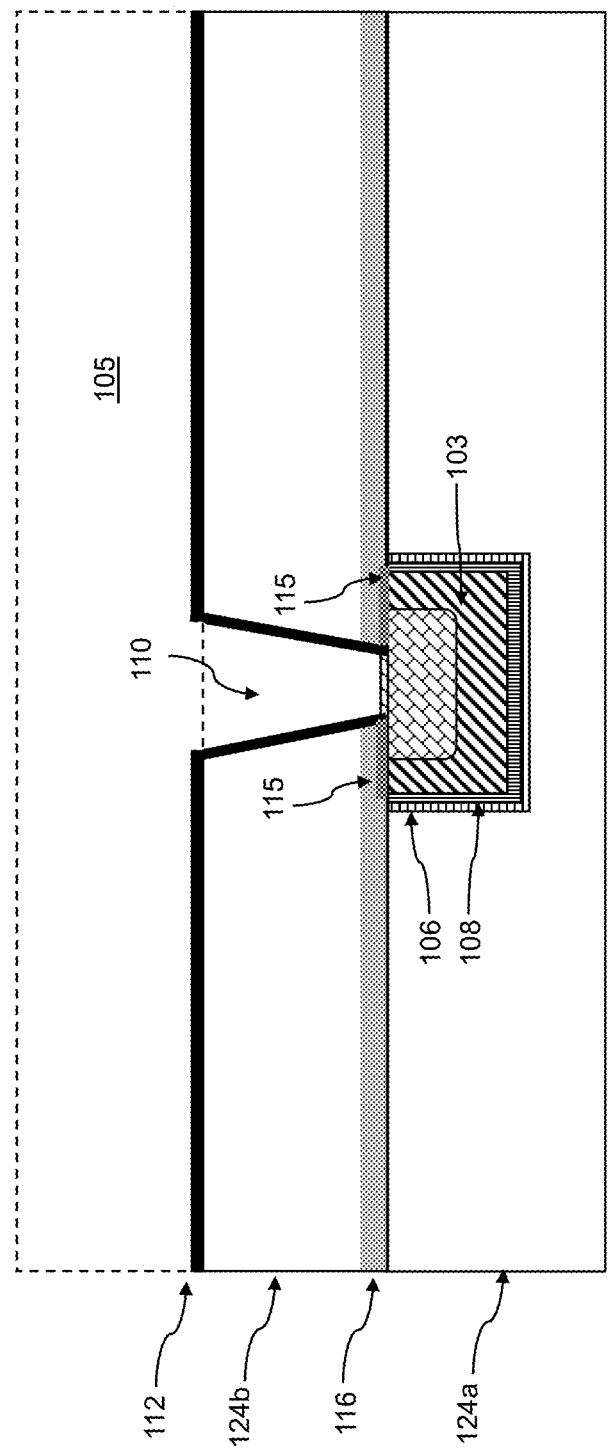
FIG. 24B is a vertical cross-sectional view illustrating a step of depositing a second interconnect-level dielectric layer, forming a via opening in the second interconnect-level dielectric layer, etching the capping layer and depositing a liner over the second interconnect-level dielectric layer in accordance with various embodiments of the disclosure.

As an alternative of the fourth embodiment, a fifth embodiment of an interconnect structure 101 may now be described with reference to FIG. 24B. In the fifth embodiment, the capping layer 115 may be etched in the step illustrated in FIG. 24A and discussed above. The preceding steps and the remaining steps of the fourth embodiment may be performed as described below with reference to FIGS. 25-28B. In the fifth embodiment, the bottom portion 100a, middle portion 100b and tip portion 100c form a continuous via 100 which does not include a capping layer 115 between the bottom portion 100a and the middle portion 100b.

Figure 25:
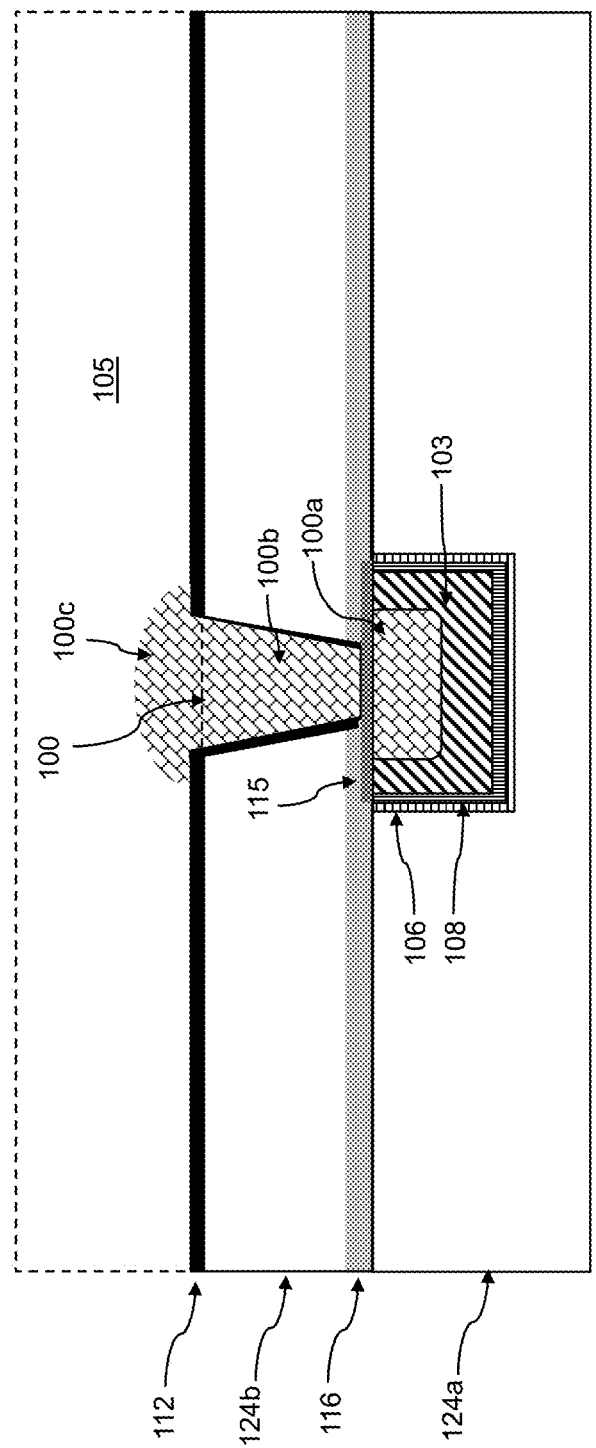
FIG. 25 is a vertical cross-sectional view illustrating a step of depositing refractory metal in the via opening in accordance with various embodiments of the disclosure.

Referring to FIG. 25, a refractory material, such as a refractory metal or alloy may be deposited in the via opening 110 and overflowing into the second trench 105 in the second interconnect-level dielectric layer 124b. In this manner, a via 100 may be formed that includes a bottom portion 100a that includes a bottom head that extends below the via opening 110 and extends laterally beyond lower edges of the via opening 110, a middle portion 100b in the via opening 110 and a top portion 100c that includes a top head that extends above the via opening 110 and extends laterally beyond upper edges of the via opening 110. The via 100 may be formed by a chemical vapor deposition process, an atomic layer deposition process or by an electrolysis plating deposition process.

Figure 26:
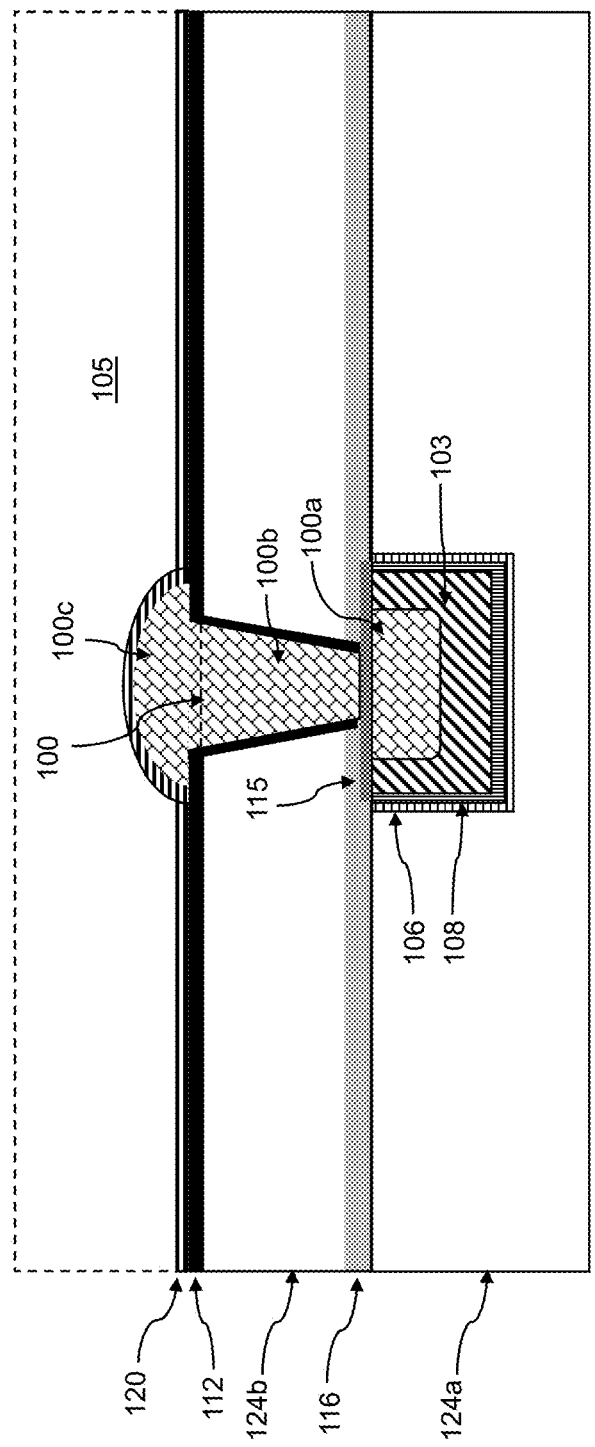
FIG. 26 is a vertical cross-sectional view illustrating a step of depositing a second conformal liner over the barrier and the refractory metal in accordance with various embodiments of the disclosure.

Referring to FIG. 26, a second conformal liner 120 may be formed over the barrier layer 112 and the top portion 100c of the via 100 in the second trench 105 in the second interconnect-level dielectric layer 124b. The second conformal liner 120 may be made of an suitable material. In various embodiments, the second conformal liner 120 is made of a material to improve adhesion of a second copper fill layer 109 to the barrier layer 112. The second conformal liner 120 made be formed by any suitable method such as chemical vapor deposition, plasma enhanced chemical vapor deposition or atomic layer deposition.

Figure 27:
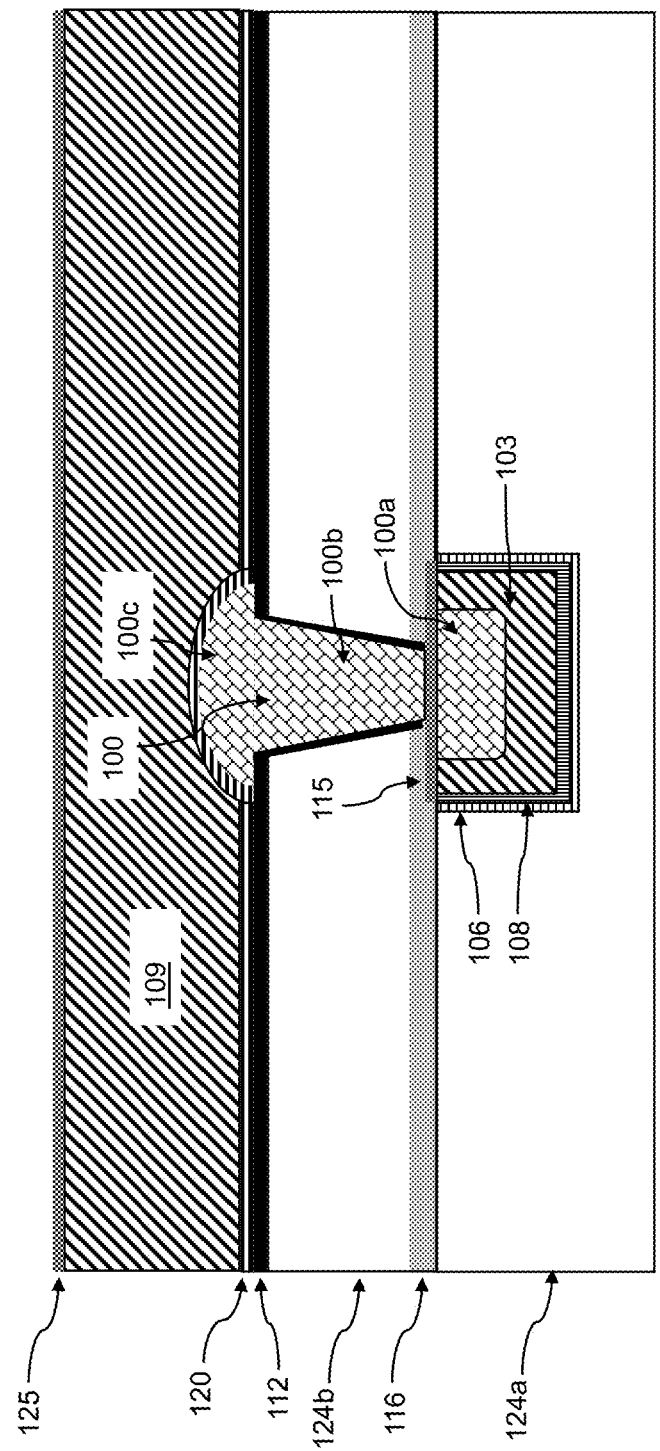
FIG. 27 is a vertical cross-sectional view illustrating a step of depositing a second copper fill layer over the second conformal liner in accordance with various embodiments of the disclosure.

Referring to FIG. 27, the second trench 105 in the second interconnect-layer dielectric layer 124b may be filled with a second copper fill layer 109. After filling the second trench 105, the surface of the second interconnect-level dielectric layer 124b and the second copper fill layer 109 may be planarized by chemical mechanical polishing. After planarizing, the surface of the second interconnect-level dielectric layer 124b and the second copper fill layer 109, a second capping layer 125 may be formed on top of the planarized surface.

Figures 28A, 28B:
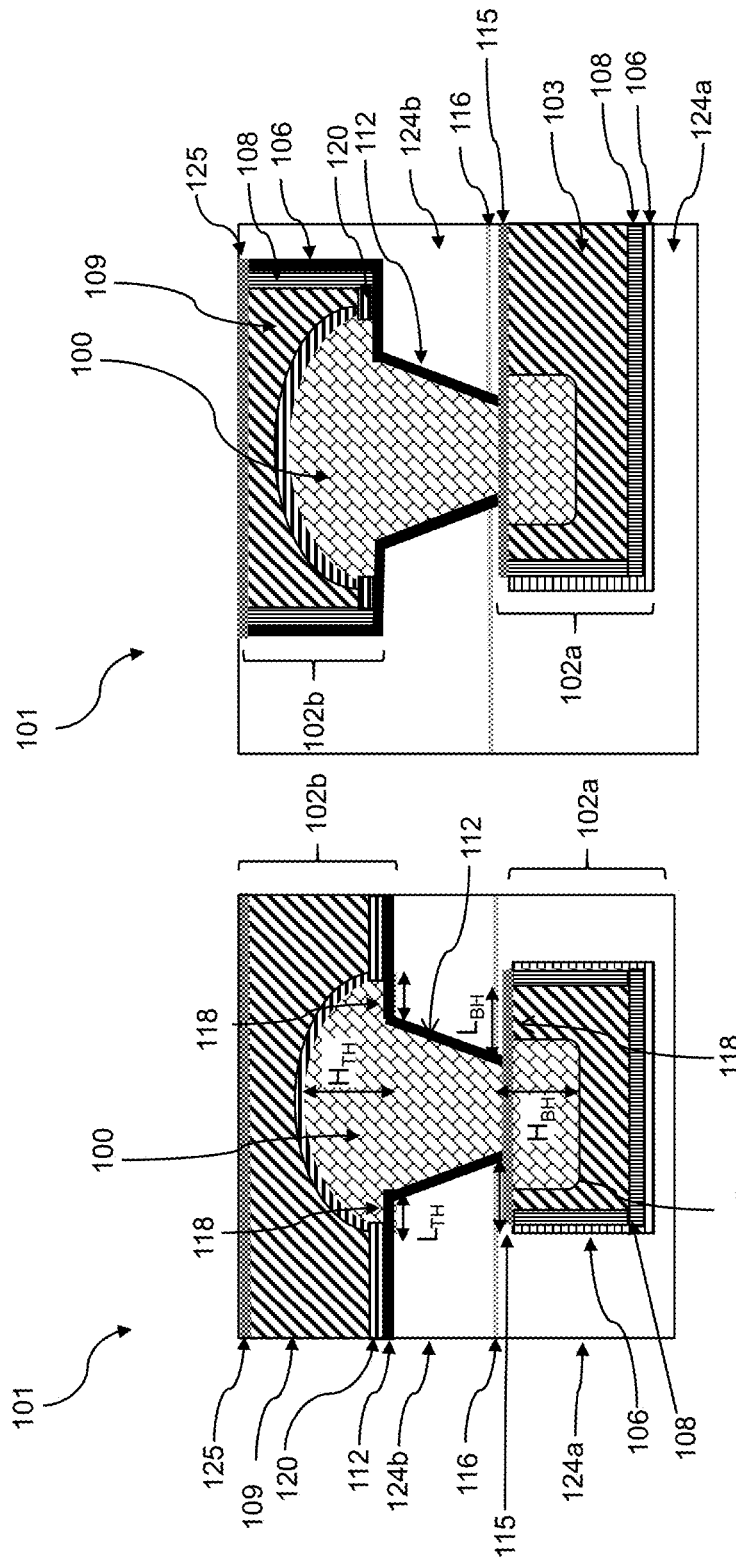
FIG. 28A is a vertical cross-sectional view of the embodiment of FIG. 27 as viewed through the line AA' in FIG. 2B.
FIG. 28B is a vertical cross-sectional view of the embodiment of FIG. 16 as viewed through the line BB' in FIG. 2B.

FIG. 28A is a vertical cross-sectional view of the fourth embodiment interconnect structure 101 shown in FIG. 27 through the line AA' in FIG. 2B. FIG. 28B is a vertical cross-sectional view of the fourth embodiment interconnect structure 101 shown in FIG. 27 through the line BB' in FIG. 2B. FIGS. 28A and 28B are similar to FIGS. 12A and 12B discussed above in regards to the first embodiment. As in the first embodiment, the via 100 of the fourth embodiment has a substantially "barbell" shape. However, the bottom portion 100a may be square or rectangular in shape. The embodiment illustrated in FIGS. 28A and 28B is otherwise the same as the first embodiment. Similar to the first embodiment, the top head of the top portion 100c of the via 100 may have a maximum height $H_{TH}$ and the bottom head of the bottom portion 100a of the via 100 may have a maximum height $H_{BH}$ in the range of 1-20 nm, such as 2-15 nm, although greater or lesser heights may be used. The top head of the top portion 100c of the via 100 may extend a length $L_{TH}$ laterally beyond the upper edges of the via opening 110 and the bottom head of the bottom portion 100a of the via 100 may extend a length $L_{BH}$ laterally beyond the lower edges of the via opening 110 in a range of 1-20 nm, such as 2-15 nm, although greater or lesser lengths may be used.

Figure 29:
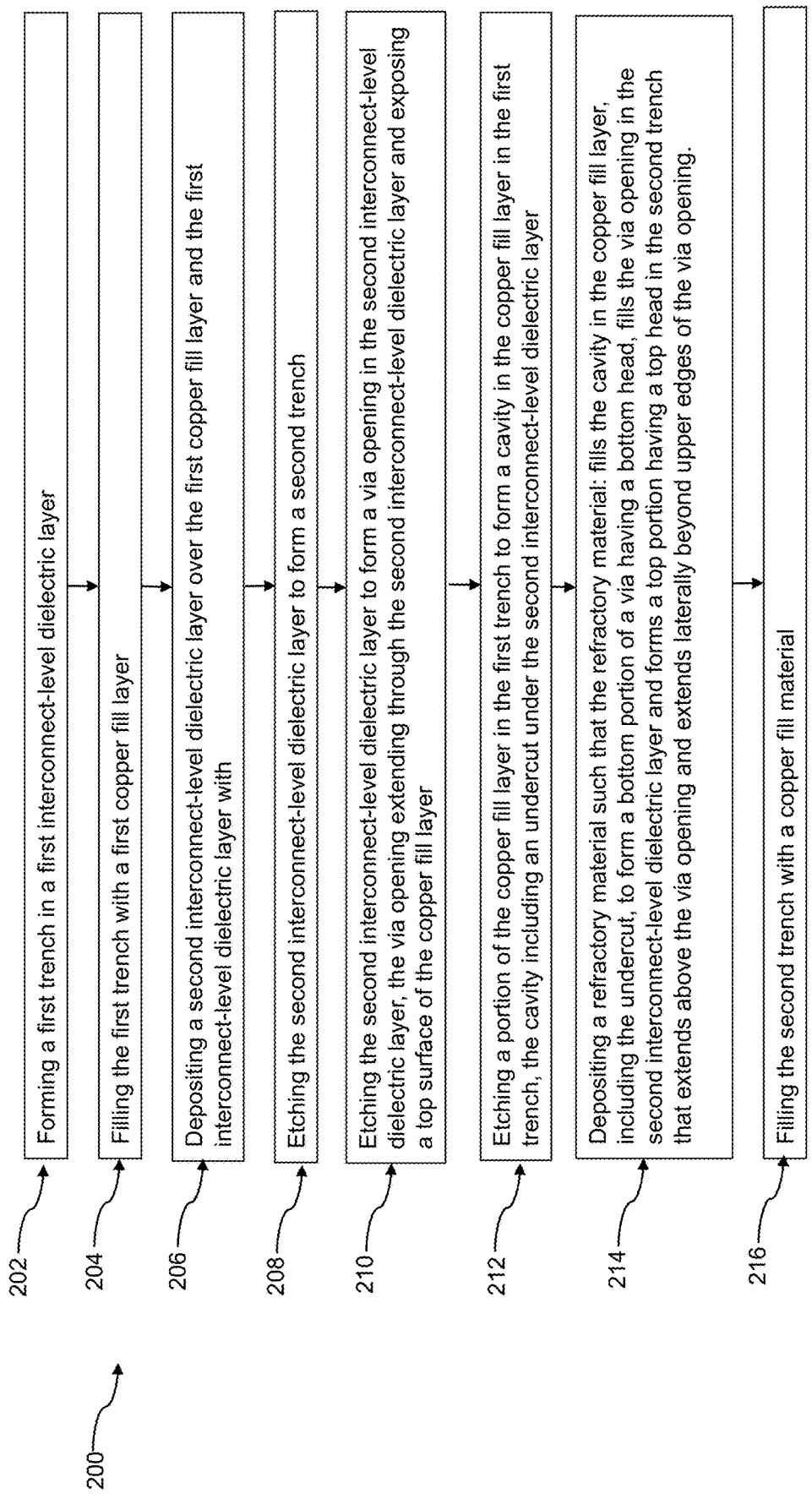
FIG. 29 is a flowchart illustrating a method of making a interconnect in accordance with various embodiments of the disclosure.

FIG. 29 is a flowchart illustrating a general method 200 of making a via 100 according to various embodiments. Referring to step 202, a first trench 104 may be formed in a first interconnect-level dielectric layer 124a. Referring to step 204, the first trench 104 may be filled with first copper fill layer 103. Referring to step 206, a second interconnect-level dielectric layer 124b may be deposited over the first copper fill layer 103 and the first interconnect-level dielectric layer 124a. Referring to step 208, the second interconnect-level dielectric layer 124b may be etched to form a second trench 105. Referring to step 210, the second interconnect-level dielectric layer 124b may be etched to form a via opening 110 in the second interconnect-level dielectric layer 124*b*, the via opening 110 extending through the second interconnect-level dielectric layer 124*b* and exposing a top surface of the first copper fill layer 103 in the first trench 104. Referring to step 212, a portion of the first copper fill layer 103 in the first trench 104 may be etched to form a cavity 113 in the first copper fill layer 103 in the first trench 104, the cavity 113 including undercuts 111 under the second interconnect-level dielectric layer 124*b*. Referring to step 214, a refractory material may be deposited such that the refractory material: fills the cavity 113 in the first copper fill layer 103, including the undercut 111, to form a bottom portion 100*a* of a via 100 having a bottom head, fills the via opening 110 in the second interconnect-level dielectric layer 124*b* and forms a top portion 100*c* having a top head in the second trench 105 that extends above the via opening 110 and extends laterally beyond upper edges of the via opening 110. Referring to step 216, a second copper fill layer 109 may be deposited to fill the second trench 105.

Figure 30:
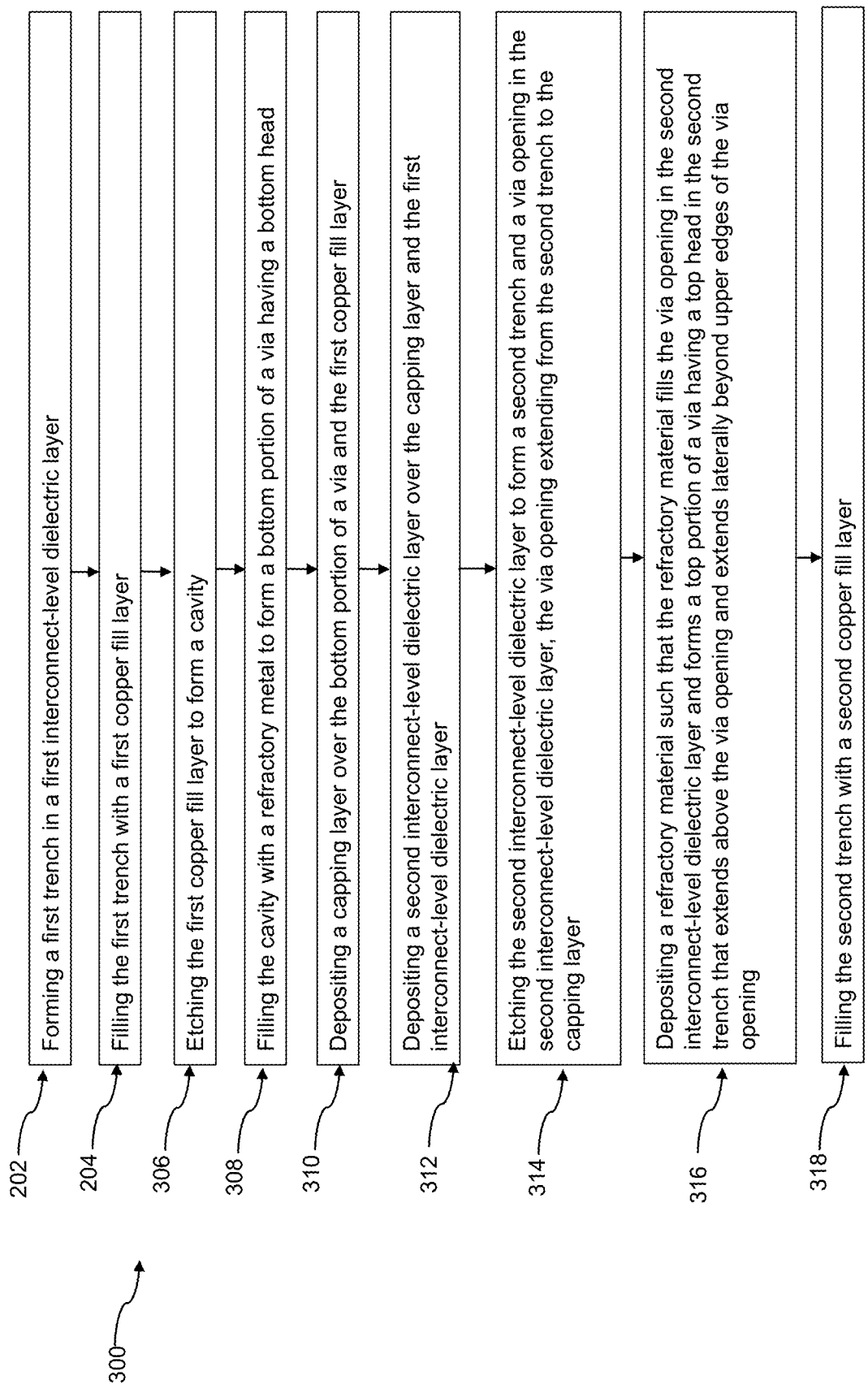
FIG. 30 is a flowchart illustrating a method of making a interconnect in accordance with other embodiments of the disclosure.

FIG. 30 is a flowchart illustrating a general method 300 of making a via 100 according to various embodiments. Referring to step 202, a first trench 104 may be formed in a first interconnect-level dielectric layer 124*a*. Referring to step 204, the first trench 104 may be filled with a first copper fill layer 103. Referring to step 306, the first copper fill layer 103 may be etched to form a cavity 123. Referring to step 308, the cavity 113 may be filled with a refractory metal to form a bottom portion 100*a* of a via 100 having a bottom head. Referring to step 310, a capping layer 115 may be deposited over the refractory metal and the first copper fill layer 103. Referring to step 312, a second interconnect-level dielectric layer 124*b* may be deposited over the capping layer 115 and the first interconnect-level dielectric layer 124*a*. Referring to step 314, the second interconnect-level dielectric layer 124*b* may be etched to form a second trench 105 and a via opening 110, the via opening 110 extending from the second trench 105 to the capping layer 115. Referring to step 316, a refractory material may be deposited such that the refractory material fills the via opening 110 in the second interconnect-level dielectric layer 124*b* and forms a top portion 100*c* having a top head in the second trench 105 that extends above the via opening 110 and extends laterally beyond upper edges of the via opening 110. Referring to step 318, the second trench 105 may be filled with a second copper fill layer 109.

Generally, the structures and methods of the present disclosure can be used to form interconnect structures 101 such as vias 100, metal line structures 102*a*, 102*b* and integrated via 100 and metal line structures 102*a*, 102*b*. The interconnect structures 101, may include the vias 100, electrically connecting at least some of the electrical components of an integrated circuit which includes a plurality of electrical components. The interconnect structures 101 of the of the present disclosure include a via 100 made of a refractory metal or alloy of refractory metals. In embodiments, the vias 100 include a bottom portion 100*a* which includes a bottom head that that extends below the via opening 110 and extends laterally beyond lower edges of the via opening 110, a middle portion 100*b* located in a via opening 110 and a top portion 100*c* which includes a top head that extends above the via opening 110 and extends laterally beyond upper edges of the via opening 110. The use of refractory metals, which can withstand higher temperatures than copper, reduces diffusion of the via atoms into the interconnect-level dielectric layers 124*a*, 124*b*, thereby reducing the formation of voids around the vias 100. Further, the use refractory metal vias with head structures that extend into the metal line structures 102*a*, 102*b* and extend beyond the edges of the vias 100 further reduce void formation by covering the void formation hot spots with slower diffusing metals.

Embodiments of the present disclosure include a via 100 including a middle portion 100*b* located in a via opening 110 in a second interconnect-level dielectric layer 124*b*, a top portion 100*c* including a top head that extends above the via opening 110 and extends laterally beyond upper edges of the via opening 110 and a bottom portion 100*a* including a bottom head that extends below the via opening 110 and extends laterally beyond lower edges of the via opening 110 in a first interconnect-level dielectric layer 124*a*. The via 100 may be formed of a refractory material.

Other embodiments are drawn to a method of a method of making an interconnect structure 101 including forming a first trench 104 in a first interconnect-level dielectric layer 124*a*, filling the first trench 104 with a first copper fill layer 103, forming a first trench 104 in a first interconnect-level dielectric layer 124*a* and filling the first trench 104 with a first copper fill layer 103. The method further includes etching the first copper fill layer 103 to form a cavity 123. The method further includes depositing a refractory metal to fill the cavity to form a bottom portion 100*a* of a via 100 having a bottom head. The method further including depositing a capping layer 115 over the bottom portion 100*a* of a via 100 and the first copper fill layer 103. The method further including depositing a second interconnect-level dielectric layer 124*b* over the capping layer 115 and the first interconnect-level dielectric layer 124*a*. The method further includes etching the second interconnect-level dielectric layer 124*b* to form a second trench 105 and a via opening 110 in the second interconnect-level dielectric layer 124*b*, the via opening 110 extending from the second trench 105 to the capping layer 115. The method including depositing a refractory material such that the refractory material fills the via opening 110 in the second interconnect-level dielectric layer 124*b* and forms a top portion 100*c* of a via 100 having a top head in the second trench 105 that extends above the via opening 110 and extends laterally beyond upper edges of the via opening 110. The method further includes filling the second trench 105 with a second copper fill layer 109.

In an embodiment, depositing a refractory material such that the refractory material fills the cavity 123 in the first copper fill layer 103 to form a bottom portion 100*a* of a via 100 having a bottom head comprises: forming a hard mask layer 130 over the first interconnect-level dielectric layer 124*a*, patterning the hard mask layer 130 to expose a portion of the surface of the first copper fill layer 103 in the first trench 104, using a single damascene process to remove a portion of the first copper fill layer 103 in the first trench 104 to form a cavity 123 in the first copper fill layer 103 and deposit refractory material to form a bottom head in the cavity 123.

Other embodiments are drawn to a method of a method of making an interconnect structure 101 including forming a first trench 104 in a first interconnect-level dielectric layer 124*a*, filling the first trench 104 with a first copper fill layer 103, depositing a second interconnect-level dielectric layer 124*b* over the first copper fill layer 103 and the first interconnect-level dielectric layer 124*a*, and etching the second interconnect-level dielectric layer 124*b* to form a second trench 105. The method also includes etching the second interconnect-level dielectric layer 124*b* to form a via opening 110 in the second interconnect-level dielectric layer 124*b*, the via opening 110 extending through the second interconnect-level dielectric layer 124*b* and exposing a top surface of the first copper fill layer 103 and etching a portion of the first copper fill layer 103 in the first trench 104 to form a cavity 113 in the first copper fill layer 103 in the first trench 104, the cavity 113 including an undercut 111 under the second interconnect-level dielectric layer 124b. The method also includes depositing a refractory material such that the refractory material: fills the cavity 113 in the first copper fill layer 103, including the undercut 111, to form a bottom portion 100a of a via 100 having a bottom head, fills the via opening 110 in the second interconnect-level dielectric layer 124b and forms a top portion 100c having a top head in the second trench 105 that extends above the via opening 110 and extends laterally beyond upper edges of the via opening 110. The method also includes filling the second trench 105 with a second copper fill layer 109.

In an embodiment, the method further includes forming a first conformal liner 114 over the first copper fill layer 103 in the cavity 113 in the copper fill layer 103. In an embodiment, the method further includes depositing a first conformal liner 114 over the top head prior to filling the second trench 105 with a second copper fill layer 109. In an embodiment, the method further includes depositing a barrier layer 112 over the top head prior to depositing the first conformal liner 114. In an embodiment, etching a portion of the first copper fill layer 103 in the first trench 104 includes: wet or dry etching of a first portion of the first copper fill layer 103, partially oxidizing a second portion of the first copper fill layer 103 in the first trench 104 to form a copper oxide portion, and etching the copper oxide portion.

In an embodiment, depositing the refractory material is performed by selective chemical vapor deposition, selective atomic layer deposition or electrolysis deposition. In an embodiment, etching the second interconnect-level dielectric layer 124b to form a second trench 105 and etching the second interconnect-level dielectric layer 124b to form a via opening 110 in the second interconnect-level dielectric layer 124b may be performed by a single damascene process or dual damascene process. In an embodiment, the method further includes planarizing a top surface of the second interconnect-level dielectric layer 124b and the second copper fill layer 109 in the second trench 105.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A via comprising:
    a middle portion located in a via opening in a second interconnect-level dielectric layer;
    a top portion comprising a top head that extends above the via opening and extends laterally beyond upper edges of the via opening;
    a bottom portion comprising a bottom head that extends below the via opening and extends laterally beyond lower edges of the via opening in a first interconnect-level dielectric layer;
    a first conformal liner located under the bottom head of the bottom portion of the via; and
    a second conformal liner located over the top head of the top portion of the via;
    wherein the via comprises a refractory material.

2. The via of claim 1, wherein the via comprises a refractory material selected from Ni, Co, Ru, Re, Ir, W, Mo, Rh, Fe, Pd, Pt, Os, Nb or alloys thereof.

3. The via of claim 1, further comprising a barrier layer located between the middle portion of the via and sidewalls of the via opening in the second interconnect-level dielectric layer.

4. The via of claim 3, wherein the barrier layer comprises a material selected from TaN, TiN, $AlO_x$, a self-assembled monolayer (SAM) or combinations thereof.

5. The via of claim 3, wherein a bottom surface of the bottom portion of the via is substantially convex.

6. The via of claim 1, wherein the first conformal liner is formed before the bottom head of the bottom portion of the via is formed.

7. The via of claim 1, wherein at least one of the first conformal liner and the second conformal liner comprises a material selected from Ta, Co, Ru or alloys thereof.

8. An interconnect structure, comprising:
    a first interconnect-level dielectric;
    a first line structure formed in the first interconnect-level dielectric;
    a second interconnect-level dielectric layer;
    a second line structure formed above the second interconnect-level dielectric layer;
    a via formed in the second interconnect-level dielectric layer and electrically connecting the first line structure to the second line structure, wherein the via comprises a refractory material and extends partially into the first line structure and into the second line structure;
    a first conformal liner located between the first line structure and the via; and
    a second conformal liner located between the second line structure and the via.

9. The interconnect structure of claim 8, wherein the via further comprises:
    a dumbbell shape having a first portion and a second portion,
    wherein the first portion and the second portion each cover junctions between the via and the first line structure and between the via and the second line structure, respectively.

10. The interconnect structure of claim 9, wherein:
    the first portion comprises a bottom head that extends below a via opening toward the first line structure and extends laterally beyond lower edges of the via opening in the first interconnect-level dielectric; and
    the second portion comprises a top head that extends above the via opening toward the first line structure and extends laterally beyond upper edges of the via opening.

11. The interconnect structure of claim 8, wherein the refractory material comprises a material selected from Ni, Co, Ru, Re, Ir, W, Mo, Rh, Fe, Pd, Pt, Os, Nb or alloys thereof.

12. The interconnect structure of claim 10, further comprising a barrier layer located between a middle portion of the via and sidewalls of the via opening in the second interconnect-level dielectric layer.

13. The interconnect structure of claim 12, wherein the barrier layer comprises a material selected from TaN, TiN, $AlO_x$, a self-assembled monolayer (SAM) or combinations thereof.

14. The interconnect structure of claim 10, wherein the first conformal liner is located under the bottom head of the first portion of the via.

15. The interconnect structure of claim 14, wherein the first conformal liner is selected from Ta, Co, Ru or alloys thereof.

16. An interconnect structure, comprising:
a first line structure comprising a first conductive material formed in a trench in a first interconnect-level dielectric;
a second interconnect-level dielectric layer;
a via comprising a refractory material having a first portion formed within the second interconnect-level dielectric layer, a second portion that extends partially into the first line structure below the second interconnect-level dielectric layer, and a third portion that extends above the second interconnect-level dielectric layer;
a first conformal liner located between the first conductive material and the refractory material, and
a second conformal liner located over the third portion of the via.

17. The interconnect structure of claim 16, wherein the refractory material comprises a material selected from Ni, Co, Ru, Re, Ir, W, Mo, Rh, Fe, Pd, Pt, Os, Nb or alloys thereof.

18. The interconnect structure of claim 16, wherein the first conformal liner is selected from Ta, Co, Ru or alloys thereof.

19. The interconnect structure of claim 16, further comprising a barrier layer located between the first portion of the via and sidewalls of a via opening in the second interconnect-level dielectric layer.

20. The interconnect structure of claim 19, wherein the barrier layer comprises a material selected from TaN, TiN, $AlO_x$, a self-assembled monolayer (SAM) or combinations thereof.

* * * * *